(12) United States Patent
Akiyama et al.

(10) Patent No.: US 11,901,889 B2
(45) Date of Patent: Feb. 13, 2024

(54) GATE DRIVE DEVICE

(71) Applicant: DENSO CORPORATION, Kariya (JP)

(72) Inventors: Hironori Akiyama, Kariya (JP); Tetsuya Dewa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/898,557

(22) Filed: Aug. 30, 2022

(65) Prior Publication Data

US 2022/0407511 A1    Dec. 22, 2022

Related U.S. Application Data

(63) Continuation of application No. PCT/JP2021/006821, filed on Feb. 24, 2021.

(30) Foreign Application Priority Data

Mar. 3, 2020   (JP) ................ 2020-035780

(51) Int. Cl.
| H02M 1/08 | (2006.01) |
| H03K 17/16 | (2006.01) |
| H03K 17/687 | (2006.01) |
| H03K 17/284 | (2006.01) |

(52) U.S. Cl.
CPC ............ H03K 17/687 (2013.01); H02M 1/08 (2013.01); H03K 17/16 (2013.01); H03K 17/284 (2013.01)

(58) Field of Classification Search
CPC ....... H02M 1/08; H03K 17/16; H03K 17/161; H03K 17/284; H03K 17/687
USPC .......................... 327/108, 109, 110
See application file for complete search history.

(56) References Cited

U.S. PATENT DOCUMENTS

| 9,172,365 | B2* | 10/2015 | Kandah ................ H03K 17/166 |
| 2003/0045041 | A1 | 3/2003 | Katoh et al. |
| 2003/0201516 | A1 | 10/2003 | Katoh et al. |
| 2007/0187217 | A1 | 8/2007 | Tai |
| 2019/0089346 | A1 | 3/2019 | Kawai |
| 2020/0021282 | A1* | 1/2020 | Yamamoto ......... H03K 17/0822 |
| 2021/0036697 | A1* | 2/2021 | Yamamoto ......... H03K 17/0822 |
| 2021/0258004 | A1 | 8/2021 | Akiyama et al. |
| 2022/0416782 | A1* | 12/2022 | Akiyama ........... H03K 17/0822 |
| 2023/0021657 | A1 | 1/2023 | Akiyama |
| 2023/0114152 | A1 | 4/2023 | Akiyama et al. |

OTHER PUBLICATIONS

U.S. Appl. No. 17/898,578, filed Aug. 30, 2022, Akiyama et al.

* cited by examiner

*Primary Examiner* — William Hernandez
(74) *Attorney, Agent, or Firm* — POSZ LAW GROUP, PLC

(57) ABSTRACT

A gate drive device drives a gate of a semiconductor switching element constituting an upper or lower arm of a half bridge circuit which supplies an output current, which is alternating current, to a load. The gate drive device detects a peak value of an element voltage which is a voltage of a main terminal of the semiconductor switching element or a change rate of the element voltage when the semiconductor switching element is switching. The gate drive device acquires a maximum value among a plurality of peak values or a plurality of change rates during a predetermined detection period including a period in which the semiconductor switching element performs switching multiple number of times.

9 Claims, 15 Drawing Sheets

GATE DRIVE DEVICE

CROSS REFERENCE TO RELATED APPLICATIONS

The present application is a continuation application of International Patent Application No. PCT/JP2021/006821 filed on Feb. 24, 2021, which designated the U.S. and claims the benefit of priority from Japanese Patent Application No. 2020-035780 filed on Mar. 3, 2020. The entire disclosures of all of the above applications are incorporated herein by reference.

TECHNICAL FIELD

The present disclosure relates to a gate drive device that drives gates of semiconductor switching elements constituting upper and lower arms of a half bridge circuit that supplies an AC output current to a load.

BACKGROUND

In a gate drive device that drives gates of semiconductor switching elements constituting upper and lower arms of a half bridge circuit, when a surge applied to a main terminal of the semiconductor switching element exceeds an element withstand voltage which is a withstand voltage of the semiconductor switching element, since there is a possibility that a failure occurs, countermeasures against the failure are required. In the present specification, the semiconductor switching element constituting the upper arm of the half bridge circuit may be referred to as an upper element, and the semiconductor switching element constituting the lower arm of the half bridge circuit may be referred to as a lower element. In the present specification, energization in which a current in a forward direction flows through the semiconductor switching element may be referred to as forward energization, and energization in which a current in a reverse direction flows through the semiconductor switching element may be referred to as reverse energization.

SUMMARY

The present disclosure provides a gate drive device. The gate drive device drives a gate of a semiconductor switching element constituting an upper or lower arm of a half bridge circuit which supplies an output current, which is alternating current, to a load. The gate drive device detects a peak value of an element voltage which is a voltage of a main terminal of the semiconductor switching element or a change rate of the element voltage when the semiconductor switching element is switching. The gate drive device acquires a maximum value among a plurality of peak values or a plurality of change rates during a predetermined detection period including a period in which the semiconductor switching element performs switching multiple number of times.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
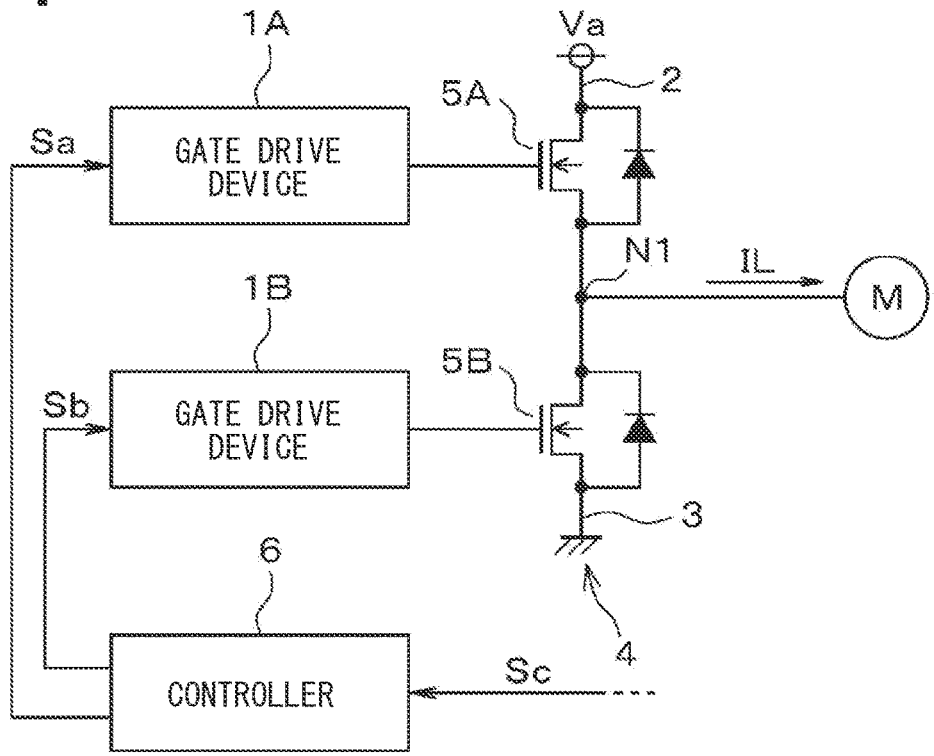
FIG. 1 is a diagram schematically illustrating a schematic configuration of a gate drive device and a half bridge circuit according to a first embodiment.

For example, during a period in which a forward energization is performed on an upper element and a reverse energization is performed on a lower element, a surge voltage is applied to a main terminal of the upper element when the upper element is turned off. Such a surge voltage is referred to as a turn-off surge. The turn-off surge is determined by a product of a slope of an element current flowing through the upper element, that is, a change rate of the element current, and a parasitic inductance of a current path determined by a system structure, and becomes larger as the change rate of the element current becomes larger. Thus, in an exemplary gate drive device, in order to prevent such a turn-off surge from exceeding the element withstand voltage, a gate resistance when the upper element is turned off is selected and is mounted by a chip resistance or the like.

However, a switching loss when the semiconductor switching element is turned off is proportional to the resistance value of the gate resistance when the semiconductor switching element is turned off. Thus, as in the above-described method of the exemplary gate drive device, when a resistance value of the gate resistance when the semiconductor switching element is turned off is set to a fixed value, an effect of suppressing the turn-off surge becomes excessive under an operation condition in which the generated turn-off surge becomes relatively low, and an increase in the switching loss becomes a problem. As described above, there is a trade-off relationship between the suppression of the turn-off surge and the reduction of the switching loss.

Thus, various techniques for operating a gate resistance, a gate current, and the like, so-called active gate techniques have been proposed in order to suppress a surge, reduce a loss, and further reduce noise. As such an active gate technique, a configuration has been proposed in which a drain-source voltage of a semiconductor switching element that is a MOSFET is measured, and a timing of a gate signal given to a gate of the semiconductor switching element is adjusted based on the measurement result.

Such timing adjustment can be implemented by changing the gate resistance value or the gate current value. Accordingly, the drain-source voltage of the semiconductor switching element, that is, a surge voltage applied to a main terminal of the semiconductor switching element is measured, and the gate resistance value and the like when the semiconductor switching element is turned off is adjusted according to the measurement result.

In the gate drive device that drives the gate of the semiconductor switching element of the half bridge circuit applied to an inverter, the driving of the semiconductor switching element is PWM-controlled such that the output current supplied to the load is controlled to be, for example, a sinusoidal alternating current. In this case, since it is desirable to reduce the number of times of switching of the semiconductor switching element in one cycle of the output current as much as possible from the viewpoint of reducing a switching loss, the number of times of switching is often set to a relatively small number of times, for example, several to several tens of times. On the other hand, the element current that affects the magnitude of the surge voltage changes each time the semiconductor switching element is switched, and a width of the change becomes larger as the number of times of switching in one cycle of the output current is smaller.

Under such circumstances, in the half bridge circuit applied to the inverter, the magnitude of the surge voltage fluctuates relatively largely each time the semiconductor switching element is switched. For example, when feedback control in which the gate resistance value is operated based on the measurement result of the surge voltage is performed each time the semiconductor switching element is switched, since a cycle of fluctuation of the element current which is a parameter to be controlled, that is, a cycle of fluctuation of the surge voltage becomes close to a control cycle, deterioration of target value followability is concerned. Thus, in this case, it is necessary to take a large margin on a safety side, and there is a possibility that a large power loss improvement effect or the like cannot be obtained.

The present disclosure provides a gate drive device capable of appropriately controlling a surge.

An exemplary embodiment of the present disclosure provides s gate drive device configured to drive a gate of a semiconductor switching element constituting an upper or lower arm of a half bridge circuit which supplies an output current, which is alternating current, to a load. The gate drive device includes a voltage detection unit, a maximum value acquisition unit, a calculation unit, and a drive unit. The voltage detection unit is configured to detect a peak value of an element voltage which is a voltage of a main terminal of the semiconductor switching element or a change rate of the element voltage when the semiconductor switching element is switching. The maximum value acquisition unit is configured to acquire and output a maximum value among a plurality of peak values or a plurality of change rates detected by the voltage detection unit during a predetermined detection period including a period in which the semiconductor switching element performs switching multiple number of times. The calculation unit is configured to calculate a value of a gate resistance or a gate current of the semiconductor switching element such that a deviation between the maximum value output from the maximum value acquisition unit and a target value of the peak value or a target value of the change rate determined according to a specification of the semiconductor switching element becomes small. The drive unit is configured to change the value of the gate resistance or the gate current of the semiconductor switching element based on a calculation result by the calculation unit, and drive the gate of the semiconductor switching element.

In the exemplary embodiment of the present disclosure, control for calculating and changing a gate resistance value or a gate current value is performed based on a detection result of a maximum value of a surge during a detection period including a period in which a semiconductor switching element performs switching multiple number of times. Since the detection result of the maximum value of the surge during the detection period is not greatly affected by fluctuation of an element current each time the semiconductor switching element is switched with respect to the detection result of the surge, that is, the detection result of the surge acquired each time the semiconductor switching element is switched, the detection result of the maximum value of the surge does not greatly fluctuate. Accordingly, according to the above configuration, the target value followability for the control of the gate resistance value or the gate current value, in other words, the surge control is improved, and as a result, the surge can be appropriately controlled.

Hereinafter, a plurality of embodiments will be described with reference to the drawings. In the embodiments, substantially the same components are denoted by the same reference numerals, and the description thereof will be omitted.

First Embodiment

Hereinafter, a first embodiment will be described with reference to FIGS. 1 to 8.

<Schematic Configuration of Gate Drive Device>

As illustrated in FIG. 1, a gate drive device 1A according to a present embodiment drives a semiconductor switching element 5A constituting an upper arm of a half bridge circuit 4 connected between a pair of DC power lines 2 and 3. A gate drive device 1B according to the present embodiment drives a semiconductor switching element 5B constituting a lower arm of the half bridge circuit 4. In this case, the gate drive devices 1A and 1B have the same configuration, and the semiconductor switching elements 5A and 5B have the same configuration. Thus, in the present specification, when it is not necessary to distinguish between the gate drive devices 1A and 1B and the semiconductor switching elements 5A and 5B, the alphabets at the ends are omitted and collectively referred to.

The half bridge circuit 4 is included in an inverter that drives a motor M. A power supply voltage Va is supplied to the half bridge circuit 4 from a DC power supply (not illustrated) such as a battery via the DC power lines 2 and 3. The semiconductor switching element 5 is a power element. In this case, the semiconductor switching element includes an N-channel MOSFET and a reflux diode connected between a drain and a source of the MOSFET with a source side as an anode, that is, connected in reversely parallel to the MOSFET. In this case, although the reflux diode is provided as an element different from the MOSFET, a body diode of the MOSFET may be used as the reflux diode.

A drain of the upper element 5A is connected to the DC power line 2 on a high potential side. A source of the upper element 5A is connected to a drain of the lower element 5B. A source of the lower element 5B is connected to the DC power line 3 on a low potential side. A node N1 which is an interconnection node between the upper element 5A and the lower element 5B is connected to the motor M corresponding to a load. As a result, a load current IL which is an output current of the half bridge circuit 4 is supplied to the motor M. A controller 6 controls the driving of the motor M by controlling an operation of the half bridge circuit 4 constituting the inverter. The controller 6 is an example of a control device that controls the operation of the half bridge circuit 4.

A detection signal Sc indicating a detection value of the load current IL output from a current detection unit (not illustrated) is given to the controller 6. Based on the detection signal Sc, the controller 6 generates and outputs an instruction signal Sa instructing an operation of the gate drive device 1A and an instruction signal Sb instructing an operation of the gate drive device 1B such that the load current IL matches a desired target current. The gate drive device 1A performs PWM control of the driving of the upper element 5A based on the instruction signal Sa given from the controller 6. The gate drive device 1B performs PWM control of the driving of the lower element 5B based on the instruction signal Sb given from the controller 6.

In this case, the upper element 5A and lower element 5B are complementarily turned on and off. Accordingly, the lower element 5B is turned off during a period in which the upper element 5A is turned on, and the upper element 5A is turned off during a period in which the lower element 5B is turned on. In the above configuration, during a period in which the load current IL flows from the node N1 to the motor M, the upper element 5A is driven such that the current flows in a forward direction from the drain to the source, and the lower element 5B is driven such that the current flows in a reverse direction from the source to the drain. In the above configuration, during a period in which the load current IL flows from the motor M to the node N1, the lower element 5B is driven such that the current flows in the forward direction from the drain to the source, and the upper element 5A is driven such that the current flows in the reverse direction from the source to the drain.

Figure 2:
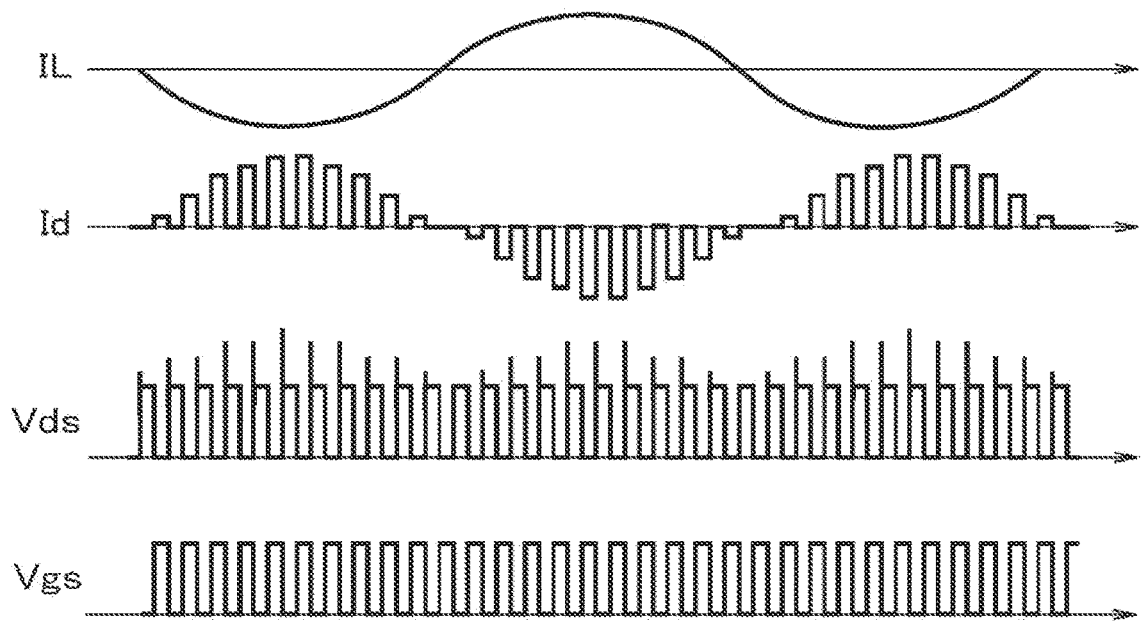
FIG. 2 is a diagram schematically illustrating a load current and waveforms of a current and a voltage related to a semiconductor switching element according to the first embodiment.

As illustrated in FIG. 2, the load current IL is a sinusoidal alternating current. In order to implement the supply of the load current IL, a drain current Id, a drain-source voltage Vds, and a gate-source voltage Vgs of the lower element 5B have waveforms illustrated in FIG. 2. Although illustration of a drain current Id, a drain-source voltage Vds, and a gate-source voltage Vgs of the upper element 5A is omitted, the upper element has similar waveforms to the waveforms of the lower element 5B except that phases are opposite to phases of the waveforms of the lower element.

In this case, the drain-source voltage Vds is a voltage of a main terminal of the semiconductor switching element 5 and corresponds to an element voltage. In this case, the drain current Id is a current flowing through the semiconductor switching element 5 and corresponds to an element current. In the present specification, the drain current Id, the drain-source voltage Vds, and the gate-source voltage Vgs may be simply referred to as a current Id, a voltage Vds, and a voltage Vgs, respectively.

Figure 3:
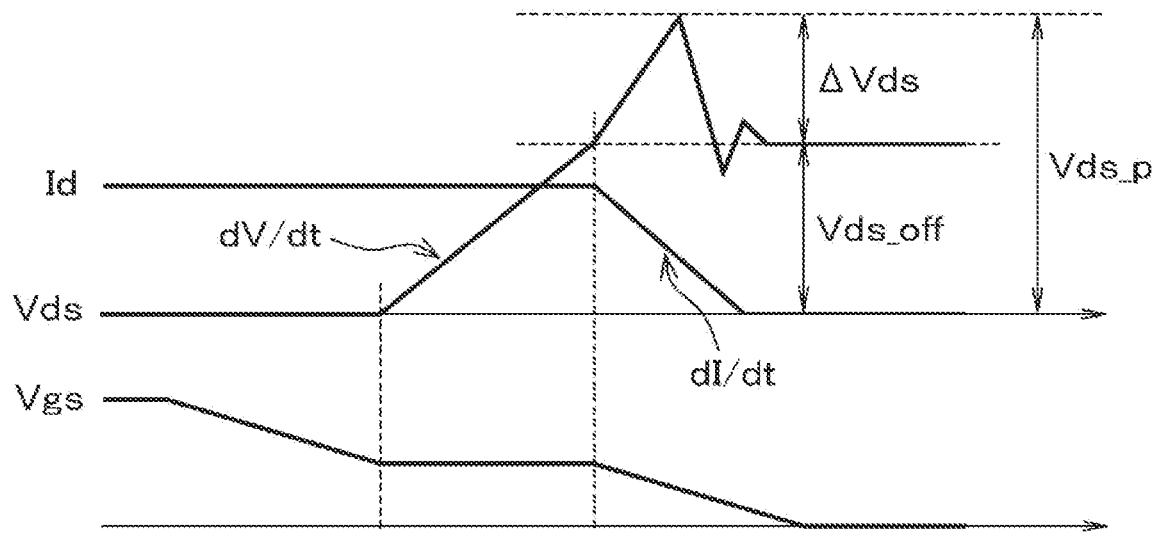
FIG. 3 is a diagram schematically illustrating waveforms of portions when the semiconductor switching element according to the first embodiment is turned off.

The waveforms of the portions when the semiconductor switching element 5 is turned off are as illustrated in FIG. 3. In FIG. 3, although the waveforms of the portions corresponding to the lower element 5B are illustrated, the similar waveforms are applied to the upper element 5A. An off-voltage Vds_off when the lower element 5B is turned off is a voltage substantially equal to the power supply voltage Va. In this case, ΔVds which is a difference between a peak voltage which is a peak value Vds_p of the voltage Vds when the lower element is turned off and the off-voltage Vds_off corresponds to a surge voltage superimposed on the lower element 5B. In this case, a slope of fluctuation of the voltage Vds corresponds to a change rate of the element voltage. In the present specification, the slope of the fluctuation of the voltage Vds may be referred to as dV/dt, and a slope of fluctuation of the current Id may be referred to as dI/dt.

<Functions of Gate Drive Device>

Figure 4:
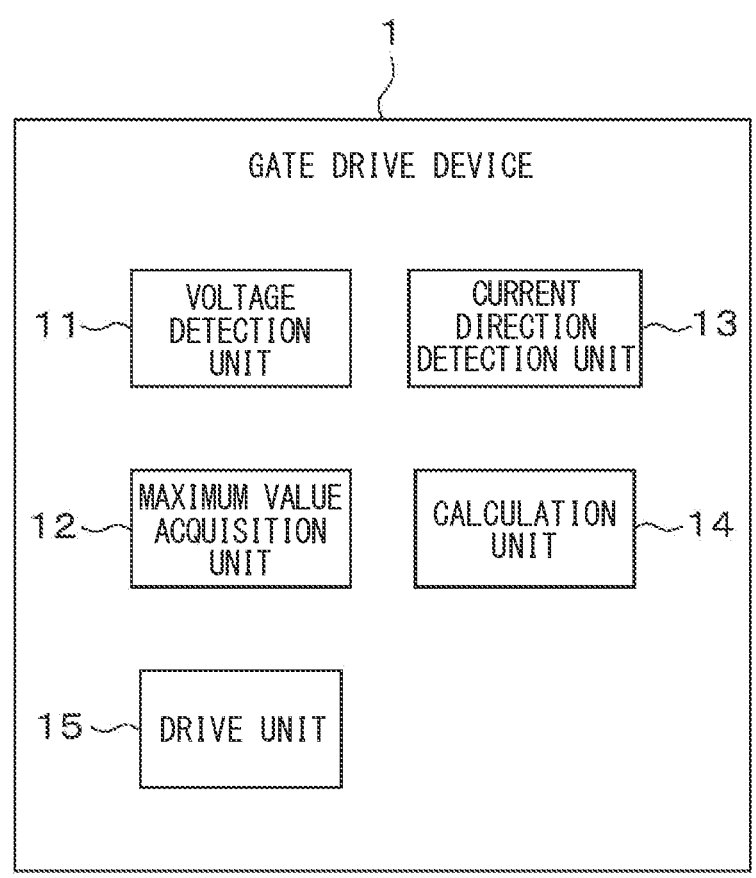
FIG. 4 is a diagram schematically illustrating each function of the gate drive device according to the first embodiment.

Next, each function of the gate drive device 1 will be described with reference to FIG. 4. In FIG. 4 and the like, each function of the gate drive device 1 is represented in the form of a functional block. A specific implementation method of each function will be described later. In the following description, of the two semiconductor switching elements 5, a semiconductor switching element to be driven by the host device is referred to as a semiconductor switching element 5 of the host arm, and a semiconductor switching element to be driven by a gate drive device 1 different from the host device is referred to as a semiconductor switching element 5 of the counter arm.

A voltage detection unit 11 detects the peak value Vds_p of the voltage Vds when the semiconductor switching element 5 of the host arm, that is, the semiconductor switching element 5 to be driven by the gate drive device 1 is switching, specifically, when the semiconductor switching element is turned off. A maximum value acquisition unit 12 acquires and outputs a maximum value Vds_p_max among a plurality of peak values Vds_p detected by the voltage detection unit 11 during a predetermined detection period. The detection period is a period including a period in which the semiconductor switching element 5 performs switching multiple number of times. In the present embodiment, the above-described detection period is a period corresponding to one cycle of the load current IL. The maximum value acquisition unit 12 acquires the maximum value Vds_p_max among the plurality of peak values Vds_p detected by the voltage detection unit 11 during a partial period of one cycle of the load current IL during the detection period, and outputs the maximum value Vds_p_max at any point in time during the detection period.

A current direction detection unit 13 directly detects a direction of the current Id flowing through the semiconductor switching element 5 of the host arm. In this case, in one cycle of the load current IL, a period in which the current Id flows in the forward direction corresponds to a period in which the energization to the semiconductor switching element 5 of the host arm becomes forward energization, and a period in which the current Id flows in the reverse direction corresponds to a period in which the energization to the semiconductor switching element 5 of the host arm becomes reverse energization.

The maximum value acquisition unit 12 acquires the maximum value Vds_p_max among the plurality of peak values Vds_p detected by the voltage detection unit 11 during a period in which the current Id flows in the forward direction in one cycle of the load current IL, that is, during a period in which the energization of the semiconductor switching element 5 of the host arm becomes the forward energization, based on the detection result of the current direction detection unit 13. The maximum value acquisition unit 12 outputs the maximum value Vds_p_max at a timing at which the current Id changes from a state of flowing in the forward direction to a state of flowing in the reverse direction, that is, at a timing at which the energization of the semiconductor switching element 5 of the host arm changes from the forward energization to the reverse energization.

A calculation unit 14 calculates a value of a gate resistance of the semiconductor switching element 5, specifically, a value of a gate resistance when the semiconductor switching element is turned off such that a deviation between the maximum value Vds_p_max output from the maximum value acquisition unit 12 and a target value of the peak value Vds_p of the voltage Vds becomes small. The target value of the peak value Vds_p of the voltage Vds is determined according to the specification of the semiconductor switching element 5, and specifically, has the following value. That is, the target value is a value lower than a withstand voltage of the semiconductor switching element 5 by a predetermined margin, and is set to such a value that there is no possibility that the semiconductor switching element 5 fails even though a voltage having the value is applied to the main terminal, but there is a possibility that the semiconductor switching element 5 fails when a voltage exceeding the value by the margin or more is applied to the main terminal.

A drive unit 15 drives a gate of the semiconductor switching element 5 of the host arm. In this case, the drive unit 15 changes a gate resistance value Rg_off when the semiconductor switching element 5 of the host arm is turned off based on the calculation result by the calculation unit 14. In this case, the calculation unit 14 is configured to execute a discrete time operation of performing calculation only at timing at which the maximum value Vds_p_max is output from the maximum value acquisition unit 12. In this case, when the calculation result by the calculation unit 14 is given, the drive unit 15 completes the change of the gate resistance value Rg_off before the maximum value acquisition unit 12 starts the operation for acquiring a next maximum value Vds_p_max.

<Specific Configuration of Gate Drive Device>

Figure 5:
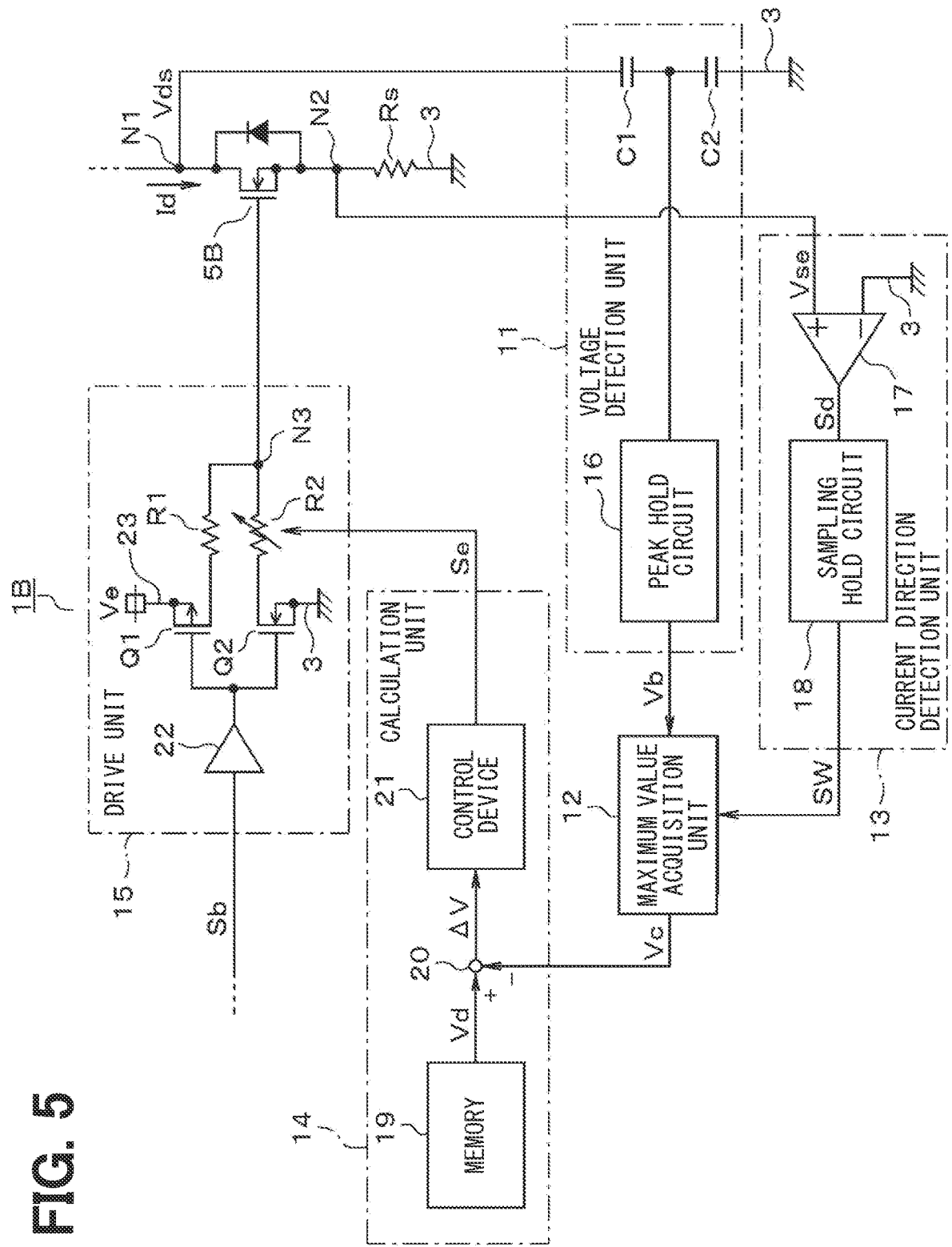
FIG. 5 is a diagram schematically illustrating a specific configuration example of the gate drive device according to the first embodiment.

As a specific configuration of the gate drive device 1 having each function described above, for example, a configuration example as illustrated in FIG. 5 can be adopted. In FIG. 5, although the specific configuration of the gate drive device 1 is illustrated by taking the gate drive device 1B that drives the lower element 5B as an example, the same configuration can be adopted for the gate drive device 1A that drives the upper element 5A. In this case, a shunt resistor Rs for detecting current Id is inserted in series between the source of the semiconductor switching element 5B and the DC power line 3.

In the gate drive device 1B illustrated in FIG. 5, capacitors C1 and C2 and a peak hold circuit 16 constitute the voltage detection unit 11, a comparator 17 and a sampling hold circuit 18 constitute the current direction detection unit 13, and a memory 19, a subtractor 20, and a controller 21 constitute the calculation unit 14. One terminal of the capacitor C1 is connected to the node N1, and the other terminal is connected to the DC power line 3 via the capacitor C2. That is, the capacitors C1 and C2 are connected in series between the drain and the source of the lower element 5B.

According to the above configuration, the series circuit of the capacitors C1 and C2 functions as a capacitance voltage dividing circuit that divides the voltage Vds of the lower element 5B. An output voltage of such a capacitance voltage dividing circuit, that is, a voltage obtained by dividing the voltage Vds by a capacitance ratio of the capacitors C1 and C2 is given to the peak hold circuit 16. The configuration for dividing the voltage Vds is not limited to the capacitance voltage dividing circuit, and other configurations can be adopted. Alternatively, the voltage Vds may be directly input to the peak hold circuit 16 without being divided. The peak hold circuit 16 is a circuit that receives a divided voltage corresponding to the voltage Vds output from an interconnection node of the capacitors C1 and C2 and holds the peak value.

The peak value held by the peak hold circuit 16 is a value corresponding to the peak value Vds_p of the voltage Vds. Thus, hereinafter, the peak value held by the peak hold circuit 16 is referred to as the peak value Vds_p. The peak hold circuit 16 is provided to acquire a peak voltage of a surge applied to the main terminal of the lower element 5B. The peak hold circuit 16 acquires the peak value Vds_p each time the lower element 5B is switched, specifically, each time the lower element 5B is turned off, and outputs an updated value as needed. The peak hold circuit 16 outputs a detection voltage Vb indicating a detection value of the peak value Vds_p. In this case, the detection voltage Vb output from the peak hold circuit 16 is given to the maximum value acquisition unit 12.

A non-inverting input terminal of the comparator 17 is connected to a node N2 which is an interconnection node between the lower element 5B and the shunt resistor Rs. As a result, a voltage Vse obtained by converting a voltage of the current Id flowing through the lower element 5B by the shunt resistor Rs is input to the non-inverting input terminal of the comparator 17. An inverting input terminal of the comparator 17 is connected to the DC power line 3 to which 0 V that is a reference potential of the circuit is applied. As a result, the comparator 17 compares the voltage Vse corresponding to the current Id with 0 V, and outputs a binary signal Sd indicating the comparison result.

According to the above configuration, it is possible to determine whether the current Id flows from the drain to the source, that is, whether the current flows in the forward direction, or whether the current Id flows from the source to the drain, that is, whether the current flows in the reverse direction based on the level of the signal Sd output from the comparator 17. Specifically, when the signal Sd is at a high level, it is determined that the current Id is flowing in the forward direction and the energization to the lower element 5B is the forward energization.

When the signal Sd is at a low level, it is determined that the current Id is flowing in the reverse direction and the energization to the lower element 5B is the reverse energization. A threshold value for the determination by the comparator 17 may not be limited to 0 V, and can be appropriately changed as long as the direction of the current Id can be determined. The comparator 17 may have a hysteresis in detection and recovery.

The sampling hold circuit 18 receives the signal Sd output from the comparator 17 and outputs a binary signal SW holding the received signal. In the above configuration, since the current Id flowing through the lower element 5B which is the semiconductor switching element 5 of the host arm is necessarily zero during the counter arm energization which is a period in which the upper element 5A which is the semiconductor switching element 5 of the counter arm is turned on, there is a possibility that the level of the signal Sd output from the comparator 17 does not become a level corresponding to the direction in which the current Id flows.

Thus, the sampling hold circuit 18 samples the signal Sd during the energization of the host arm which is a period in which the lower element 5B is turned on, and complements the signal by holding the sampling result during the energization of the counter arm. According to such a configuration, it is possible to reliably determine the direction of the current Id based on the level of the signal SW output from the sampling hold circuit 18, and eventually, it is possible to reliably determine whether the energization to the lower element 5B is the forward energization or the reverse energization. The signal SW is at a high level when the energization to the lower element 5B is the forward energization, that is, during a period in which the current Id flows in the forward direction, and is at a low level when the energization to the lower element 5B is the reverse energization, that is, during a period in which the current Id flows in the reverse direction.

Such a signal SW is given to the maximum value acquisition unit 12. During a period in which the signal SW is at the high level, that is, when the energization to the lower element 5B is the forward energization, the maximum value acquisition unit 12 selects a maximum value from among the detection values of the peak values Vds_p indicated by the detection voltages Vb input each time the lower element is turned off, that is, searches for the maximum value. Then, at a timing at which the signal SW changes from the high level to the low level, that is, at a timing at which the energization to the lower element 5B changes from the forward energization to the reverse energization, the maximum value acquisition unit 12 outputs the detection voltage Vc indicating the maximum value Vds_p_max selected at this point in time to the calculation unit 14.

That is, in the above configuration, the detection voltage Vc indicating the maximum value Vds_p_max which is a largest value of the plurality of peak values Vds_p obtained during a period in which the energization to the lower element 5B is the forward energization in one cycle of the load current IL is input to the calculation unit 14. In other words, in the above configuration, the detection voltage Vc indicating the maximum value Vds_p_max corresponding to the peak value Vds_p when a largest turn-off surge occurs in one cycle of the load current IL is input to the calculation unit 14. The maximum value acquisition unit 12 initializes the held maximum value Vds_p_max after the detection voltage Vc is output, and starts searching for the maximum value again from a timing at which the signal SW changes from the low level to the high level, that is, a timing at which the energization to the lower element 5B becomes forward energization next time.

The memory 19 stores the target value described above, that is, the target value of the peak value Vds_p determined according to the specification of the semiconductor switching element 5. The memory 19 outputs a target voltage Vd indicating the stored target value. Instead of the memory 19, the target voltage Vd may be input to the calculation unit 14 from the outside of the gate drive device 1B. The target voltage Vd is given to a positive input of the subtractor 20, and the detection voltage Vc is given to a negative input thereof. The subtractor 20 obtains a deviation ΔV corresponding to a difference between the maximum value Vds_p_max and the target value by subtracting the detection voltage Vc from the target voltage Vd, and outputs the deviation ΔV to the controller 21.

The controller 21 is a digital PID controller, and executes PID calculation on the deviation ΔV to generate an instruction signal Se indicating a value of the gate resistance such that the deviation ΔV becomes small, more specifically, the deviation ΔV becomes 0. The instruction signal Se is output to the drive unit 15. Various types of controllers such as a controller that performs PI calculation, a controller that performs P calculation, and other feedback controllers can be adopted as the controller 21. In the present embodiment, the controller 21 operates in synchronization with a timing at which the detection voltage Vc is output from the maximum value acquisition unit 12, in other words, a timing at which the detection voltage Vc is input. That is, the controller 21 is configured to execute a discrete time operation of performing calculation only at a timing at which the detection voltage Vc is input.

The drive unit 15 is configured to drive the gate of the lower element 5B at a constant voltage, and includes a buffer 22, a transistor Q1 which is a P-channel MOFET, a transistor Q2 which is an N-channel MOSFET, and resistors R1 and R2. The buffer 22 receives, as an input, the instruction signal Sb and outputs a signal corresponding to the input signal. An output terminal of the buffer 22 is connected to each gate of the transistors Q1 and Q2. A source of the transistor Q1 is connected to a DC power line 23 to which a power supply voltage Ve is supplied. The power supply voltage Ve is a voltage based on a potential of the DC power line 3, and is a voltage sufficiently higher than a gate threshold voltage of the lower element 5B.

A drain of the transistor Q1 is connected to a node N3 via the resistor R1. The node N3 is connected to the gate of the lower element 5B. The resistor R1 functions as a gate resistance when the lower element 5B is turned on together with a wiring resistor of a path from the DC power line 23 to the gate of the lower element 5B. The resistor R1 has a constant resistance value. A source of the transistor Q2 is connected to the DC power line 3. A drain of the transistor Q2 is connected to the node N3 via the resistor R2.

The resistor R2 functions as a gate resistance when the lower element 5B is turned off together with a wiring resistor of a path from the DC power line 3 to the gate of the lower element 5B. The resistor R2 is configured to be able to change a resistance value thereof based on the instruction signal Se given from the calculation unit 14. That is, in the above configuration, the gate resistance value Rg_off when the lower element 5B is turned off is changed based on the instruction signal Se. The resistance value of the resistor R2 can be changed by various methods such as a method using a variable resistor, a method using switching of a resistor ladder, and a method of operating the on-resistance of the transistor Q2.

Figure 6:
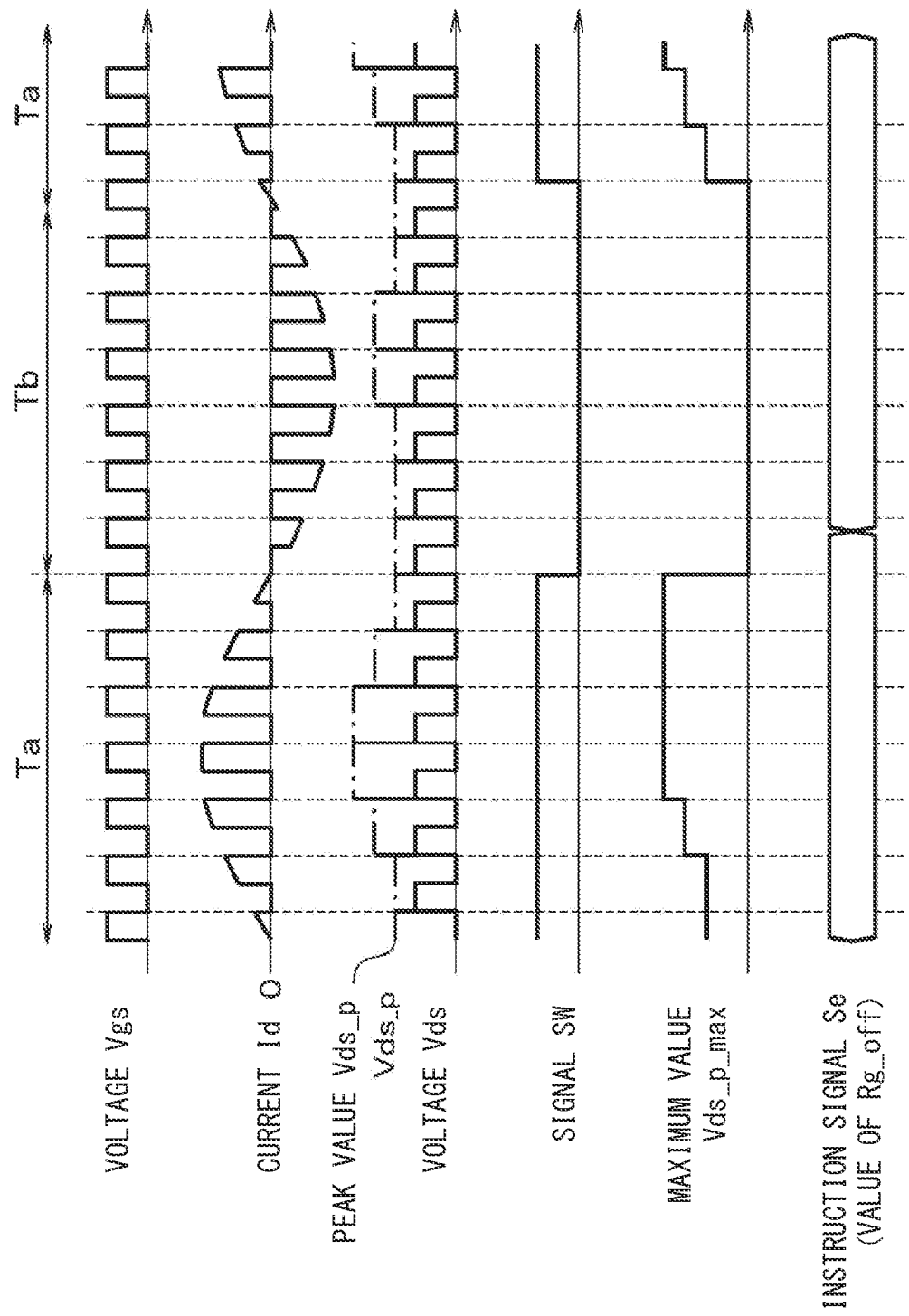
FIG. 6 is a timing chart for describing a timing of each control by the gate drive device according to the first embodiment.

Next, a timing of each control by the above configuration will be described with reference to FIG. 6. Here, although the control mainly on the gate drive device 1B side will be described as an example, the control mainly on the gate drive device 1A side has the same contents. Although FIG. 6 illustrates broken lines extending in a vertical direction so as to coincide with falling timings of the voltage Vgs, an interval between the broken lines corresponds to a drive cycle of the semiconductor switching element 5. In this case, a period Ta corresponds to a period which is a first-half phase of one cycle of the load current IL, that is, a period in which a current phase becomes 0 degrees to 180 degrees, and a period Tb corresponds to a period that is a second-half phase of one cycle of the load current IL, that is, a period in which the current phase becomes 180 degrees to 360 degrees.

In this case, when the current Id is a positive value, that is, the period Ta in which the current Id flows in the forward direction is a period in which the energization to the lower element 5B which is the semiconductor switching element 5 of the host arm is the forward energization. Thus, during the period Ta, a turn-off surge occurs. On the other hand, when the current Id is a negative value, that is, the period Tb in which the current Id flows in the reverse direction is a period in which the energization to the lower element 5B is the reverse energization. Thus, during the period Tb, a recovery surge occurs.

The recovery surge occurs due to a reverse recovery characteristic of the reflux diode connected in reversely parallel to the semiconductor switching element 5. Similar to the turn-off surge, such a recovery surge is determined by a product of a change rate of a current and a parasitic inductance. However, the current in this case corresponds to the recovery current in the reflux diode. Unlike the turn-off surge, the recovery surge has no correlation with the gate resistance value Rg_off when the lower element 5B which is the semiconductor switching element 5 of the host arm is turned off, and can be operated according to the gate resistance value when the upper element 5A which is the semiconductor switching element 5 of the counter arm is turned on.

As described above, during the period Ta in which the turn-off surge occurs, since the signal SW is at the high level, the maximum value Vds_p_max is searched from the detection values of the peak value Vds_p. As a result, during the period Ta, the maximum value Vds_p_max is updated as needed. At a timing at which the period Ta is switched to the period Tb in which the recovery surge occurs, the detection voltage Vc indicating the maximum value Vds_p_max selected at this point in time is given to the calculation unit 14.

Thus, the calculation by the calculation unit 14 is started from a start point in time of the period Tb. As a result, the calculation unit 14 generates the instruction signal Se indicating the gate resistance value Rg_off such that the deviation ΔV between the detection voltage Vc and the target voltage Vd becomes zero, and outputs the instruction signal to the drive unit 15. The drive unit 15 switches the gate resistance value Rg_off based on the instruction signal Se. In the present embodiment, the drive unit 15 completes the change of the gate resistance value Rg_off from a turn-off start point in time of a predetermined drive cycle which is a start point in time of the period Tb in which the calculation by the calculation unit 14 is started to a turn-off start point in time of a next drive cycle.

However, the drive unit 15 can complete the change of the gate resistance value Rg_off at any timing from the start point in time of the period Tb and an end point in time of the period Tb, that is, a start point in time of a next period Ta. As a result, in the next period Ta, the drive unit 15 drives the gate of the lower element 5B in a state where the gate resistance value Rg_off when the lower element is turned off is changed.

The maximum value Vds_p_max is initialized at the start point in time of the period Tb. During the period Tb, since the signal SW is at the low level, the search for the maximum value Vds_max is not performed. Thus, during the period Tb, the maximum value Vds_p_max is maintained at zero which is the initialized value. Since the signal SW changes to the high level at a start point in time of the next period Ta, the search for the maximum value Vds_p_max is resumed, and the control as described above is repeated.

According to the present embodiment described above, the following effects are obtained.

The voltage detection unit 11 detects the peak value Vds_p of the voltage Vds when the semiconductor switching element 5 of the host arm is switching. The peak value Vds_p of the voltage Vds when the semiconductor switching element is switching is a value corresponding to the magnitude of the surge applied to the main terminal of the semiconductor switching element 5. Thus, in this case, it can be said that the voltage detection unit 11 detects the magnitude of the surge applied to the main terminal of the semiconductor switching element 5 of the host arm.

The maximum value acquisition unit 12 acquires and outputs the maximum value Vds_p_max among the plurality of peak values Vds_p detected by the voltage detection unit 11 during a predetermined detection period including a period in which the semiconductor switching element 5 performs switching multiple number of times. That is, in this case, it can be said that the maximum value acquisition unit 12 acquires and outputs the maximum value of the surge during the detection period. The calculation unit 14 calculates the value of the gate resistance of the semiconductor switching element 5 such that the deviation between the maximum value Vds_p_max output from the maximum value acquisition unit 12 and the target value of the peak value Vds_p determined according to the specification of the semiconductor switching element 5 becomes small. That is, in this case, it can be said that the calculation unit 14 calculates the value of the gate resistance such that the maximum value of the surge matches the target value. The drive unit 15 changes the gate resistance value Rg_off of the semiconductor switching element 5 based on the calculation result by the calculation unit 14, and drives the gate of the semiconductor switching element 5.

According to such a configuration, control for calculating and changing the gate resistance value is performed based on the detection result of the maximum value of the surge during the detection period including the period in which the semiconductor switching element 5 performs switching multiple number of times. Since the detection result of the maximum value of the surge during the detection period described above is not greatly affected by the fluctuation of the current Id for each switching with respect to the detection result of the surge, that is, the detection result of the surge acquired for each switching of the semiconductor switching element 5, the detection result of the maximum value of the surge does not greatly fluctuate. Accordingly, according to the above configuration, the target value followability for the control of the gate resistance value, in other words, the surge control is improved, and as a result, the surge can be appropriately controlled.

In this case, the detection period is a period corresponding to one cycle of the load current IL, and the maximum value acquisition unit 12 acquires the maximum value Vds_p_max among the plurality of peak values Vds_p detected by the voltage detection unit 11 in a partial period of one cycle of the load current IL during the detection period, and outputs the maximum value Vds_p_max at any point in time during the detection period. Specifically, the maximum value acquisition unit 12 acquires the maximum value Vds_p_max among the plurality of peak values Vds_p detected by the voltage detection unit 11 during a period in which the current phase is in a range of 0 degrees to 180 degrees, which is a period in which the current Id flows in the forward direction, in one cycle of the load current IL. The maximum value acquisition unit 12 outputs the maximum value Vds_p_max at a timing at which a state where the current Id flows in the forward direction is switched to a state where the current Id flows in the reverse direction, that is, at a timing at which the current phase becomes 180 degrees.

Figure 7:
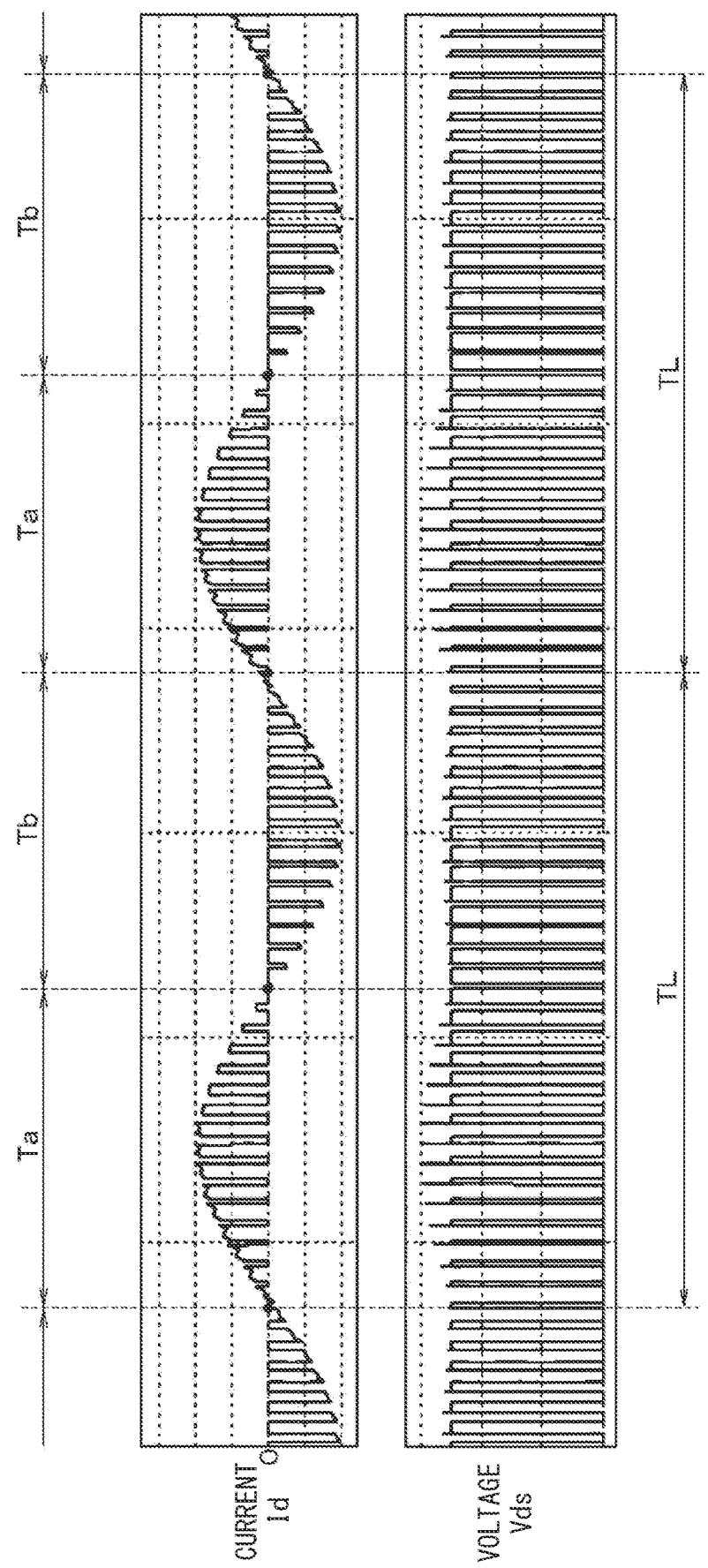
FIG. 7 is a timing chart for describing fluctuations of a drain current and a drain-source voltage for each cycle of a load current according to the first embodiment.

According to such a configuration, the following effects are obtained. That is, as illustrated in FIG. 7, in general, when a load of the inverter is stably operated, the peak value of the current Id per cycle of the load current IL does not greatly fluctuate. In general, a mechanism for suppressing rapid fluctuation of the peak value of the current Id even when the load is increased and decreased is provided in the inverter. Thus, it can be considered that the peak value itself of the current Id for each cycle of the load current IL does not fluctuate greatly. In FIG. 7 and the following description, periods respectively corresponding to the period Ta and the period Tb in FIG. 6 are denoted by the same reference numerals. In FIG. 7, a period TL from the start point in time of the period Ta to the end point in time of the period Tb corresponds to one cycle of the load current IL.

As illustrated in FIG. 7, the peak value Vds_p of the voltage Vds, that is, the turn-off surge becomes the maximum value when the current Id becomes the largest in a partial period of one cycle of the load current IL, specifically, during the period Ta in which the current phase is in a range of 0 degrees to 180 degrees. Thus, when the peak value Vds_p at a timing at which the current Id peaks can be suppressed to be equal to or less than an element withstand voltage of the semiconductor switching element 5, it is considered that the surge applied to the main terminal of the semiconductor switching element 5 does not exceed the element withstand voltage in all the regions.

In the present embodiment, as described above, feedback control in which the maximum value Vds_p_max during the period Ta in which the current phase is in a range of 0 degrees to 180 degrees is acquired for each cycle of the load current IL and the gate resistance value Rg_off based on the maximum value Vds_p_max during the period Tb in which the current phase is in a range of 180 degrees to 360 degrees is calculated and changed is performed.

Thus, in the present embodiment, since a control cycle of the gate resistance value Rg_off, eventually, a control cycle of the surge is a period equivalent to the period TL which is the cycle of the load current IL, there is no influence of the fluctuation of the current Id for each switching of the semiconductor switching element 5. That is, according to the present embodiment, since the peak value itself of the current Id does not greatly fluctuate in each control cycle of the gate resistance value Rg_off, the target value followability for the surge control is further improved, and as a result, the turn-off surge can be more appropriately controlled.

In order to implement such control, it is necessary to determine whether the period is a turn-off surge occurrence period in which the energization of the semiconductor switching element 5 of the host arm becomes the forward energization or a recovery surge occurrence period in which the energization of the semiconductor switching element 5 of the host arm becomes the reverse energization. In the present embodiment, the current direction detection unit 13 that detects the direction of the current Id flowing through the semiconductor switching element 5 of the host arm is provided, and the period is determined based on the direction of the current Id detected by the current direction detection unit.

The current direction detection unit 13 includes the comparator 17 that compares the voltage Vse corresponding to the current Id with 0 V. According to such a configuration, since the level of the signal Sd output from the comparator 17 is at a level corresponding to the direction in which the current Id flows during the energization of the host arm which is a period in which the semiconductor switching element 5 of the host arm is turned on, it is possible to accurately determine whether the energization of the semiconductor switching element 5 of the host arm is the forward energization or the reverse energization. However, in this case, since the current Id flowing through the semiconductor switching element 5 of the host arm is necessarily zero during the counter arm energization which is a period in which the semiconductor switching element 5 of the counter arm is turned on, the level of the signal Sd may not be a level corresponding to the direction in which the current Id flows.

Thus, the current direction detection unit 13 includes the sampling hold circuit 18 that samples the signal Sd during the energization of the host arm and holds and complements the sampling result during the energization of the counter arm, and determines the energization based on the level of the signal SW output from the sampling hold circuit 18. According to such a configuration, it is possible to reliably determine the direction of the current Id, and eventually, it is possible to reliably determine whether the energization of the semiconductor switching element 5 of the host arm is the forward energization or the reverse energization.

In this case, the calculation unit 14 is configured to execute a discrete time operation of performing calculation only at a timing at which the detection voltage Vc indicating the maximum value Vds_p_max is output from the maximum value acquisition unit 12. In this case, when the calculation result by the calculation unit 14 is given, the drive unit 15 completes the change of the gate resistance value Rg_off before the maximum value acquisition unit 12 starts the operation for acquiring the next maximum value. By doing this, when the gate resistance value Rg_off is calculated based on the maximum value Vds_p_max in one predetermined cycle of the load current IL, the calculation result is actually reflected in the gate resistance value Rg_off at a point in time when the next one cycle of the load current IL is started. According to such control, the optimization of the gate resistance value Rg_off can be more reliably implemented, that is, the above-described effect can be more reliably obtained.

<Modification Regarding Detection of Current Id>

Figure 8:
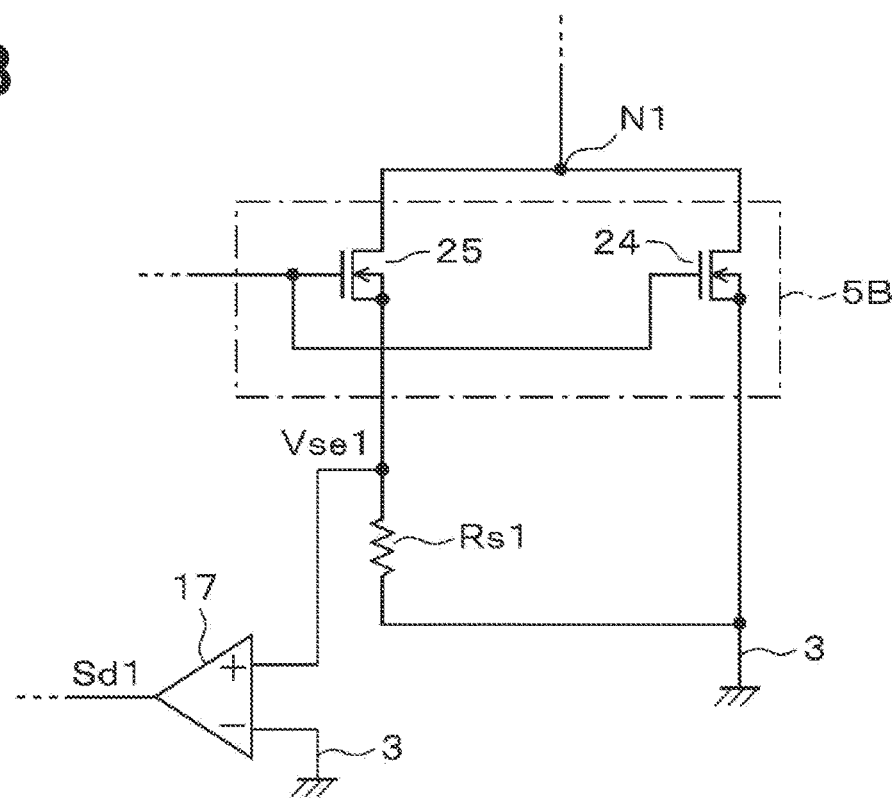
FIG. 8 is a diagram illustrating a modification related to detection of the drain current.

In the specific configuration example illustrated in FIG. 5, although the current direction detection unit 13 is configured to directly detect the current Id of the semiconductor switching element 5 of the host arm based on the terminal voltage of the shunt resistor Rs interposed in series between the semiconductor switching element 5 and the DC power line 3, the current direction detection unit 13 may be configured to indirectly detect the current Id of the semiconductor switching element 5 of the host arm as in a modification illustrated in FIG. 8, for example.

In the modification illustrated in FIG. 8, an element including a main cell 24 and a sense cell 25 is adopted as the lower element 5B which is the semiconductor switching element 5 of the host arm. In FIG. 8, the illustration of the reflux diode is omitted. The main cell 24 and the sense cell 25 are formed on the same semiconductor chip, and a size of the sense cell 25 is several hundred to several 1/1000 with respect to a size of the main cell 24.

A drain of the main cell 24 is connected to the node N1, and a source thereof is connected to the DC power line 3. The sense cell 25 is for detecting a current Id flowing through the main cell 24, and a current corresponding to the current Id flowing through the main cell 24 flows at a predetermined dividing ratio. The shunt ratio is determined by a size ratio of the main cell 24 and the sense cell 25, and the like. The drain of the sense cell 25 is connected to the node N1, and the source thereof is connected to the DC power line 3 via a shunt resistor Rs1.

In this case, the comparator 17 compares a voltage Vse1 obtained by voltage conversion of the current flowing through the sense cell 25 by the shunt resistor Rs1 with 0 V, and outputs a binary signal Sd1 indicating the comparison result. Similar to the signal Sd in the configuration illustrated in FIG. 5, such a signal Sd1 is at a level corresponding to the direction of the current Id during the energization of the host arm. Accordingly, according to such a modification as well, the current direction detection unit 13 can reliably determine the direction of the current Id, and eventually, can accurately determine whether the energization to the semiconductor switching element 5 of the host arm is the forward energization or the reverse energization.

Second Embodiment

Hereinafter, a second embodiment will be described with reference to FIGS. 9 to 13.

<Functions of Gate Drive Device>

Figure 9:
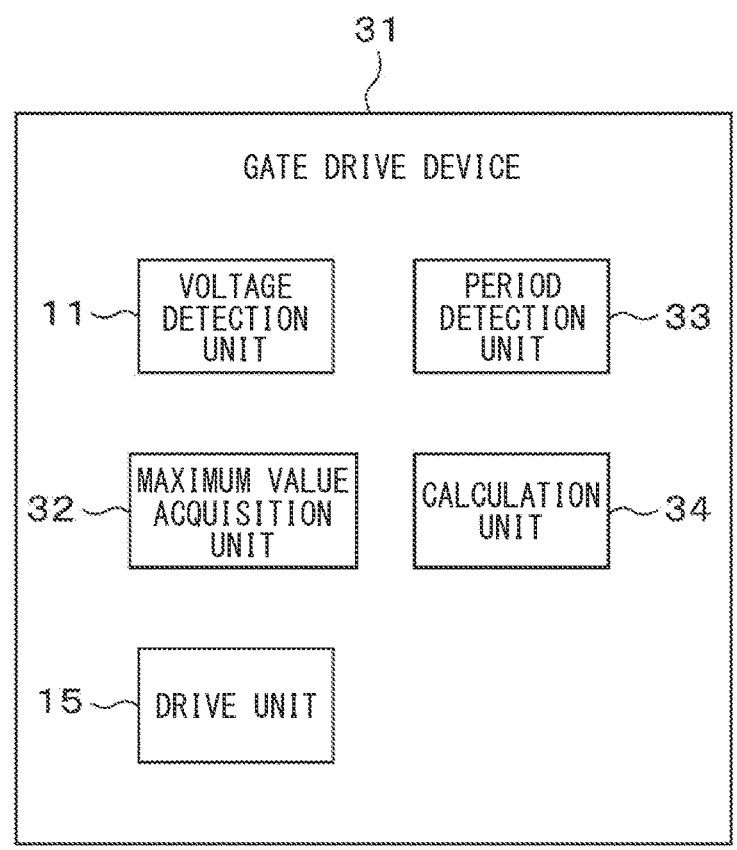
FIG. 9 is a diagram schematically illustrating each function of a gate drive device according to a second embodiment.

The present embodiment is different from the first embodiment in some of the functions of the gate drive device. That is, as illustrated in FIG. 9, a gate drive device 31 of the present embodiment is different from the gate drive device 1 of the first embodiment in that a maximum value acquisition unit 32 is provided instead of the maximum value acquisition unit 12, a period detection unit 33 is provided instead of the current direction detection unit 13, and a calculation unit 34 is provided instead of the calculation unit 14.

The maximum value acquisition unit 32 acquires a maximum value Vds_p_max among a plurality of peak values Vds_p detected by a voltage detection unit 11 before a point in time when a predetermined determination time has elapsed from a timing at which a semiconductor switching element 5 starts to be turned off. In this case, the maximum value acquisition unit 32 acquires the maximum value Vds_p_max in an acquisition period detected by the period detection unit 33. Similarly to the calculation unit 14, the calculation unit 34 calculates a value of a gate resistance when the semiconductor switching element 5 is turned off such that a deviation between the maximum value Vds_p_max output from the maximum value acquisition unit 32 and a target value of the peak value Vds_p of the voltage Vds becomes small.

<Specific Configuration of Gate Drive Device>

Figure 10:
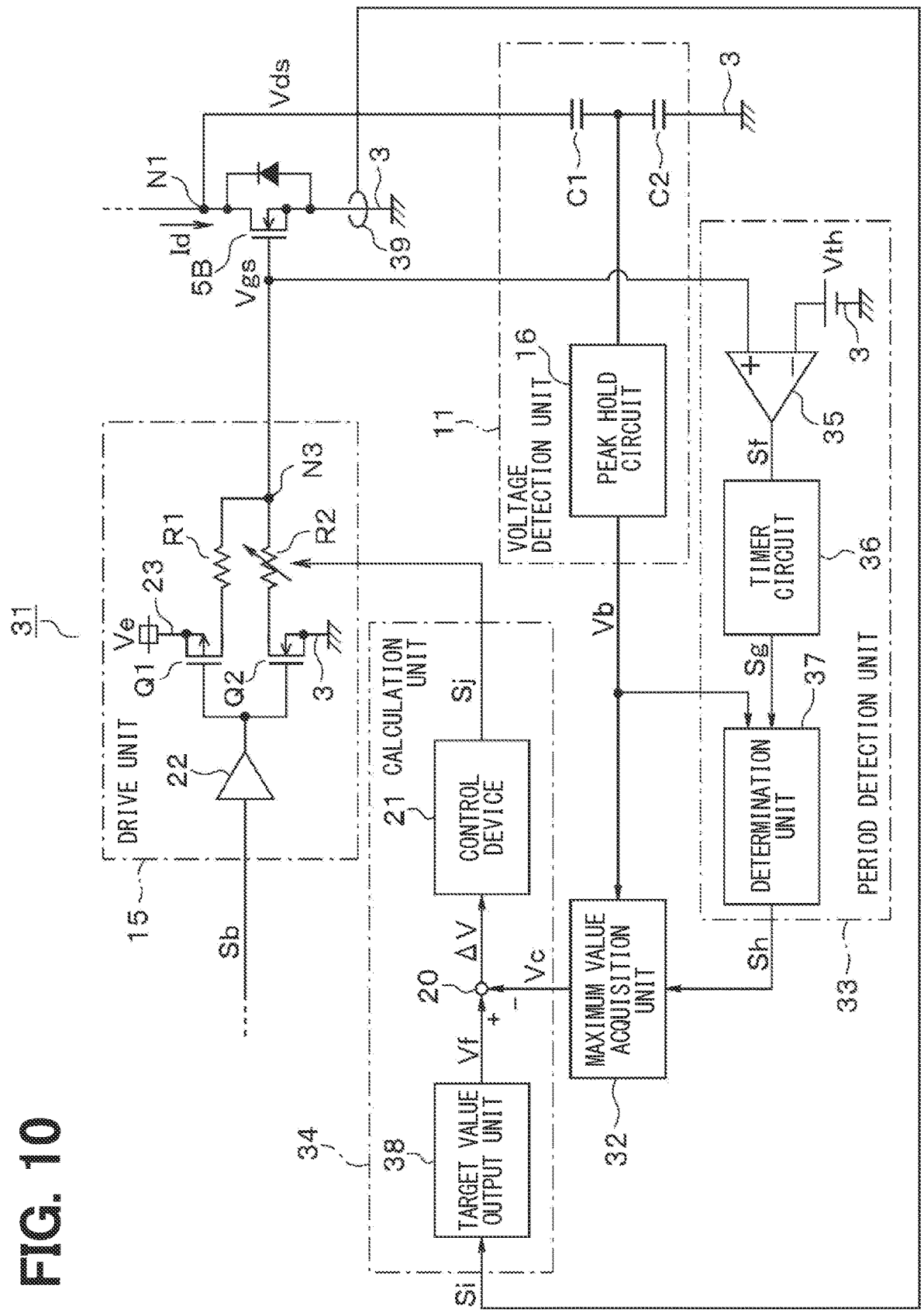
FIG. 10 is a diagram schematically illustrating a specific configuration example of the gate drive device according to the second embodiment.

As a specific configuration of the gate drive device 31 having each function described above, for example, a configuration example illustrated in FIG. 10 can be adopted. In FIG. 10, although a configuration for driving a lower element 5B is illustrated, the same configuration can be adopted for a configuration for driving an upper element 5A. In the gate drive device 31 illustrated in FIG. 10, a comparator 35, a timer circuit 36, and a determination unit 37 constitute the period detection unit 33, and a target value output unit 38, a subtractor 20, and a controller 21 constitute the calculation unit 34.

In this case, a detection voltage Vb output from the voltage detection unit 11 is given to the maximum value acquisition unit 32 and the period detection unit 33. As the acquisition period described above, the period detection unit 33 detects a period in which energization to the lower element 5B which is the semiconductor switching element 5 of the host arm is the forward energization. Thus, the period detection unit 33 has a function of determining whether the energization to the lower element 5B is the forward energization or the reverse energization. A specific configuration for implementing such a function is as follows.

That is, a non-inverting input terminal of the comparator 35 is connected to a node N3, that is, a gate of the lower element 5B. A predetermined threshold voltage Vth is input to an inverting input terminal of the comparator 35. The threshold voltage Vth is a voltage based on a potential of a DC power line 3, and is, for example, a voltage value equivalent to a gate threshold voltage of the semiconductor switching element 5. As a result, the comparator 35 compares a voltage Vgs of the lower element 5B with the voltage Vth, and outputs a binary signal Sf indicating the comparison result.

According to the above configuration, the on and off of the lower element 5B can be determined based on a level of the signal Sf output from the comparator 35. Specifically, it can be determined that the lower element 5B is turned on, that is, the gate is turned on when the signal Sf is at a high level, and the lower element 5B is turned off, that is, the gate is turned off when the signal Sf is at a low level. As described above, a timing at which the lower element 5B starts to be turned off can be grasped based on the signal Sf at the level corresponding to a state where the gate is turned on or the gate is turned off. Instead of such a configuration, it is also possible to have a configuration in which the timing at which the lower element 5B starts to be turned off is grasped based on another signal such as an instruction signal Sb.

The signal Sf output from the comparator 35 is input to the timer circuit 36. The timer circuit 36 outputs a binary signal Sg that is at a high level for a certain time corresponding to the above-described determination period from a timing at which the signal Sf changes from a high level to a low level, that is, a timing at which the lower element 5B starts to be turned off. The detection voltage Vb and the signal Sg are input to the determination unit 37. Although details will be described later, a turn-off surge which is a surge generated during a period in which the energization to the semiconductor switching element 5 of the host arm is the forward energization occurs immediately after the gate is turned off. On the other hand, a recovery surge which is a surge generated during a period in which the energization to the semiconductor switching element 5 of the host arm is the reverse energization does not occur immediately after the gate is turned off.

Thus, the determination unit 37 determines that the energization to the lower element 5B is the forward energization when the detection voltage Vb input during a period in which the signal Sg is at the high level, that is, during a period before a point in time when a determination time elapses from the timing at which the lower element 5B starts to be turned off exceeds a predetermined determination voltage. When the detection voltage Vb input in the above period is equal to or lower than the determination voltage, the determination unit 37 determines that the energization to the lower element 5B is the reverse energization. The determination voltage can be set to any voltage value that can determine the presence or absence of the surge. The determination unit 37 outputs a binary signal Sh indicating such a determination result.

Similarly to the signal SW of the first embodiment, the signal Sh is at a high level when it is determined that the energization to the lower element 5B is the forward energization, and is at a low level when it is determined that the energization is the reverse energization. In this case, a period in which the signal Sh is at the high level indicates the above-described acquisition period. Such a signal Sh is given to the maximum value acquisition unit 32. Similarly to the maximum value acquisition unit 12 of the first embodiment, the maximum value acquisition unit 32 searches for the maximum value Vds_p_max and the like based on the signal Sh. As a result, in the above configuration, similarly to the first embodiment, the detection voltage Vc indicating the maximum value Vds_p_max corresponding to the peak value Vds_p when a largest turn-off surge occurs in one cycle of the load current IL is input to the calculation unit 34.

Figure 11:
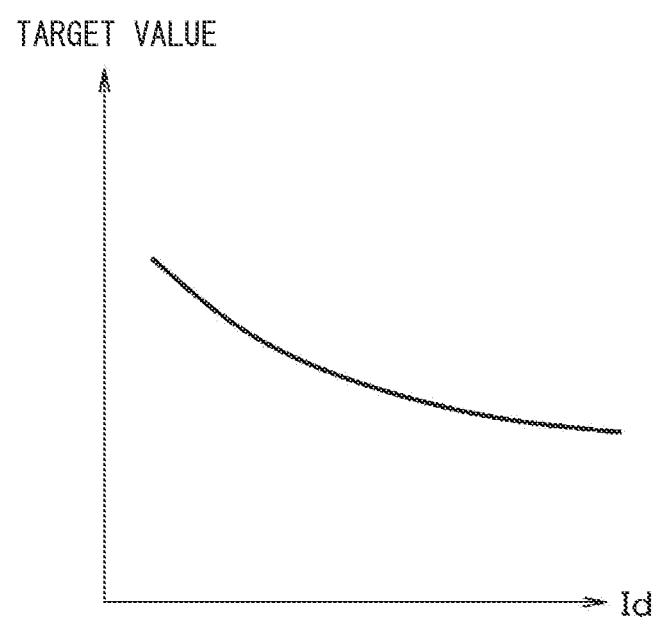
FIG. 11 is a diagram schematically illustrating a relationship between a target value and a drain current according to the second embodiment.

In the calculation unit 34, a detection signal Si corresponding to the detection value by the current detection unit 39 that detects the current Id of the lower element 5B is input to the target value output unit 38. The current detection unit 39 can adopt various configurations such as a configuration using the shunt resistor Rs illustrated in FIG. 5 and a configuration using the sense cell 25 and the shunt resistor Rs1 illustrated in FIG. 8. The target value output unit 38 includes a storage device such as a memory, and map data created based on a relationship between the target value and the current Id flowing through the semiconductor switching element 5 is stored in the memory. The relationship between the target value and the current Id is, for example, as illustrated in FIG. 11. Such map data can be generated in advance based on results of simulation, experiment, and the like performed in advance.

The target value output unit 38 acquires a current value of the current Id based on the detection signal Si, acquires a target value corresponding to the current value of the current Id from the map data while referring to the map data, and outputs a target voltage Vf corresponding to the acquired target value. A target voltage Vf is given to a positive input of the subtractor 20, and a detection voltage Vc is given to a negative input thereof. The subtractor 20 obtains a deviation ΔV corresponding to a difference between the maximum value Vds_p_max and the target value by subtracting the detection voltage Vc from the target voltage Vf, and outputs the deviation ΔV to controller 21. The controller 21 has the same configuration as the configuration of the first embodiment, and executes PID calculation on the deviation ΔV to generate an instruction signal Sj indicating a value of the gate resistance such that the deviation ΔV decreases. The instruction signal Sj is output to the drive unit 15. In this case, in the drive unit 15, a gate resistance value Rg_off when the lower element 5B is turned off is changed based on the instruction signal Sj.

Figure 12:
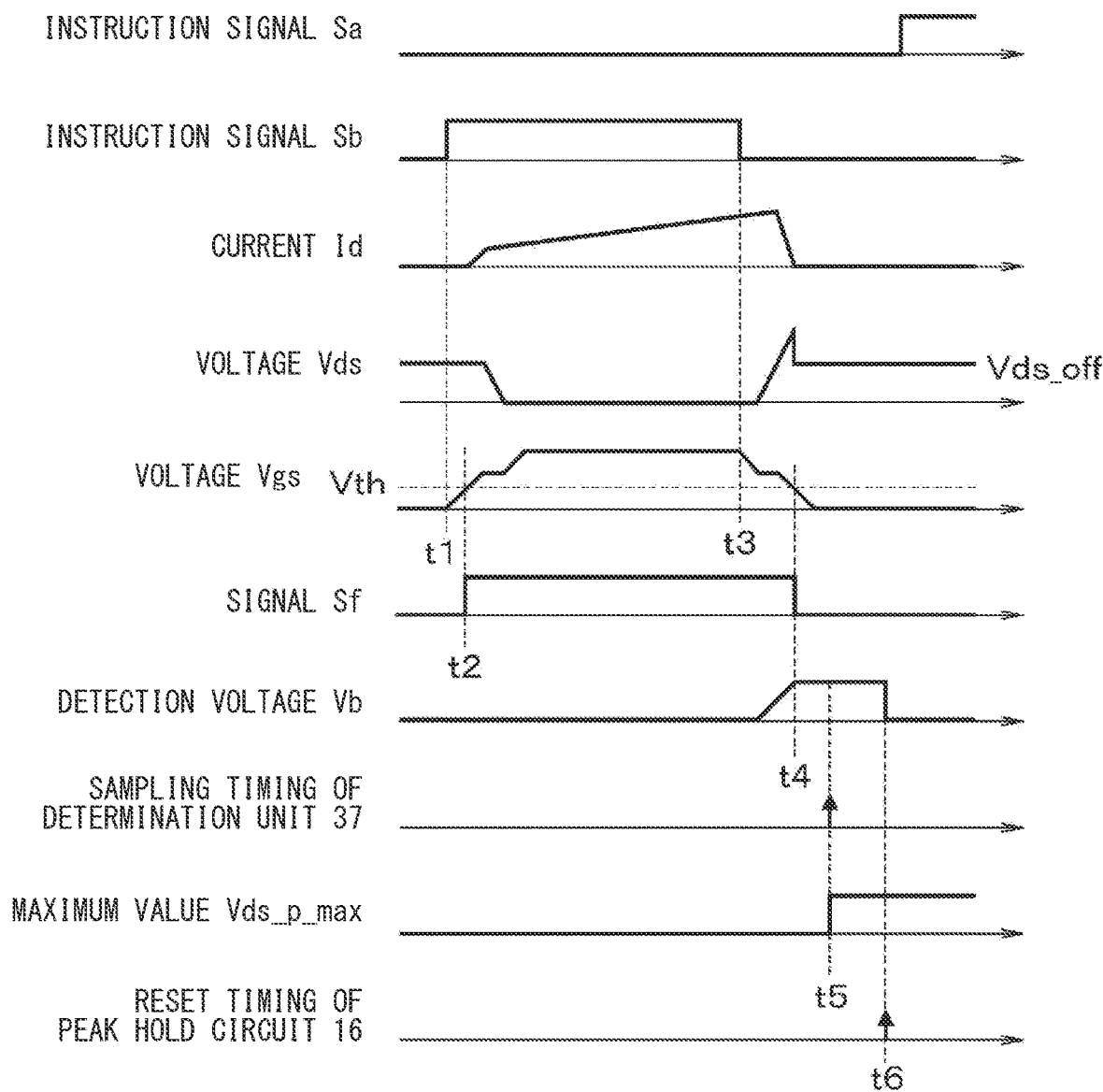
FIG. 12 is a timing chart for describing a timing of each control by the gate drive device during forward energization according to the second embodiment.
Figure 13:
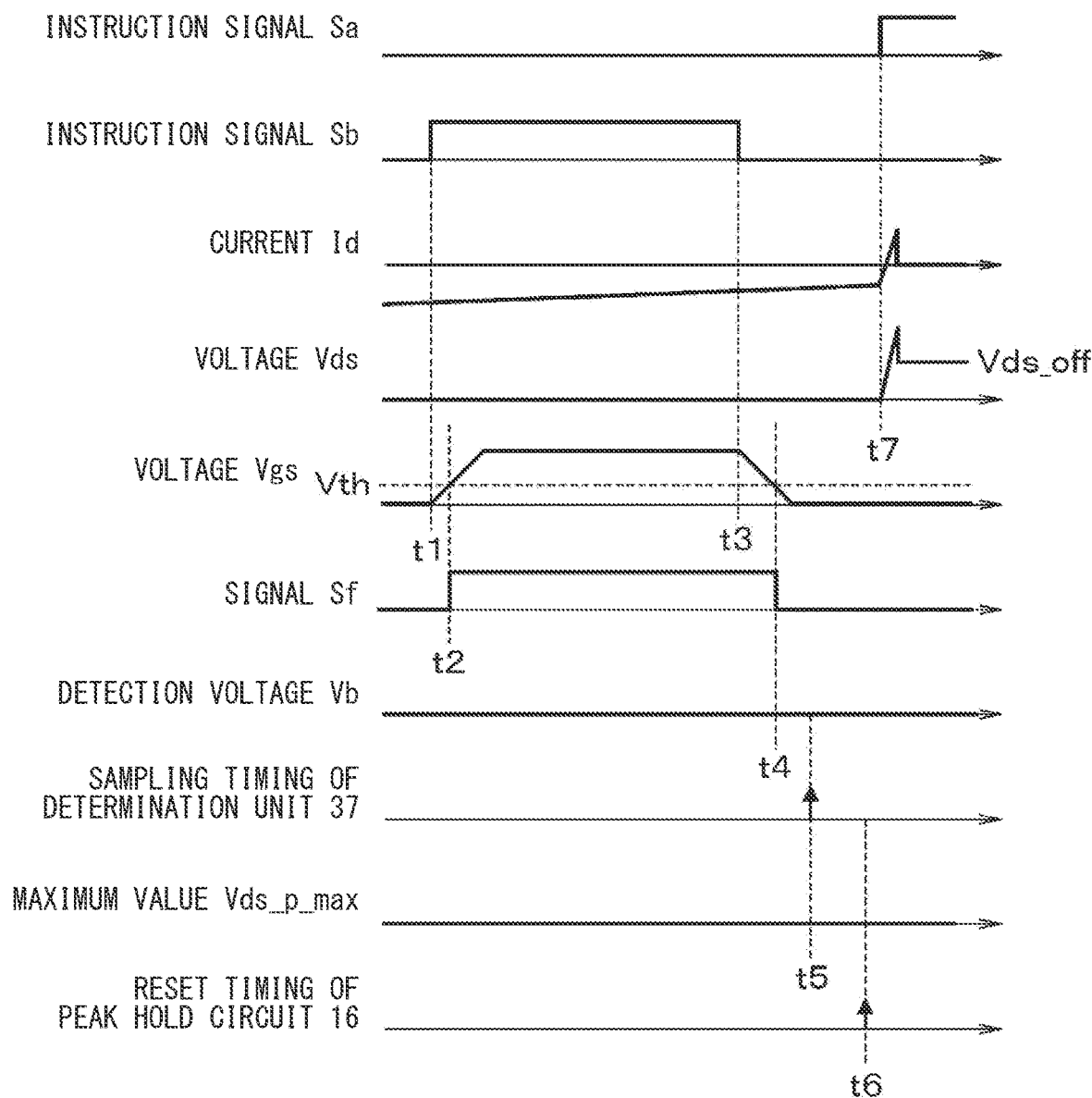
FIG. 13 is a timing chart for describing a timing of each control by the gate drive device during reverse energization according to the second embodiment.

Next, a timing of each control with the above configuration will be described with reference to FIGS. 12 and 13. Here, although the control mainly on the gate drive device 31 side for driving the lower element 5B will be described as an example, the control mainly on the gate drive device side for driving the upper element 5A has the same contents. In FIGS. 12 and 13, instruction signals Sa and Sb are represented as binary signals that give an instruction to turn on a high level and give an instruction to turn off a low level.

First, a timing of each control when the energization to the lower element 5B which is the semiconductor switching element 5 of the host arm is the forward energization will be described with reference to FIG. 12. In this case, when the instruction signal Sb changes from a low level to a high level at time t1, the voltage Vgs starts to increase. In this case, as the voltage Vgs increases, the current Id increases and the voltage Vds decreases. When the voltage Vgs reaches the threshold voltage Vth at time t2, the signal Sf changes from a low level to a high level.

Thereafter, when the instruction signal Sb changes from a high level to a low level at time t3, the voltage Vgs starts to decrease. When the voltage Vgs reaches the threshold voltage Vth at time t4, the signal Sf changes from a high level to a low level. Although not illustrated, the signal Sg is at a high level from time t4 until the determination time elapses. In this case, since the energization to the lower element 5B is the forward energization, the surge occurs immediately after time t3 which is a timing at which the lower element 5B starts to be turned off, and the voltage Vds sharply increases beyond an off-voltage Vds_off.

Thus, the detection voltage Vb higher than 0 V is input to the determination unit 37. The determination unit 37 samples the detection voltage Vb at time t5 when a predetermined time has elapsed from time t4. In this case, since a value of the detection voltage Vb obtained by sampling exceeds the determination voltage, the determination unit 37 outputs the signal Sh at the high level. As a result, the maximum value acquisition unit 32 searches for the maximum value Vds_p_max. An output of a peak hold circuit 16 is reset at time t6 when a predetermined time has elapsed from time t5.

Subsequently, a timing of each control when the energization to the lower element 5B which is the semiconductor switching element 5 of the host arm is the reverse energization will be described with reference to FIG. 13. In this case, when the instruction signal Sb changes from a low level to a high level at time t1, the voltage Vgs also starts to increase. However, in this case, since the lower element 5B performs a reflux operation, the current Id and the voltage Vds do not greatly change, and the voltage Vds is maintained at 0 V. When the voltage Vgs reaches the threshold voltage Vth at time t2, the signal Sf changes from a low level to a high level.

Thereafter, when the instruction signal Sb changes from a high level to a low level at time t3, the voltage Vgs starts to decrease. When the voltage Vgs reaches the threshold voltage Vth at time t4, the signal Sf changes from a high level to a low level. Although not illustrated, the signal Sg is at a high level from time t4 until the determination time elapses. In this case, since the energization to the lower element 5B is the reverse energization, the surge does not occur immediately after time t3 which is a timing at which the lower element 5B starts to be turned off, and the voltage Vds is maintained at 0 V.

Thus, the detection voltage Vb of 0 V is input to the determination unit 37. The determination unit 37 samples the detection voltage Vb at time t5 when a predetermined time has elapsed from time t4. In this case, since the value of the detection voltage Vb obtained by sampling is equal to or less than the determination voltage, the determination unit 37 outputs the signal Sh at the low level. As a result, the maximum value acquisition unit 32 does not search for the maximum value Vds_p_max. In this case, the output of the peak hold circuit 16 is also reset at time t6 when a predetermined time has elapsed from time t5. In this case, the recovery surge occurs immediately after time t7 when the instruction signal Sa changes from a low level to a high level, that is, time t7 which is a timing at which the upper element 5A which is the semiconductor switching element 5 of the counter arm starts to be turned on, and the voltage Vds rapidly increases beyond the off-voltage Vds_off.

According to the configuration of the present embodiment described above, similarly to the first embodiment, since control for calculating and changing the gate resistance value is performed based on the detection result of the maximum value Vds_p_max during the detection period including the period in which the semiconductor switching element 5 performs switching multiple number of times, specifically, during the period in which the current phase of the load current IL is in a range of 0 degrees to 180 degrees, it is possible to obtain the same effect as the effect of the first embodiment, that is, an effect of appropriately controlling the turn-off surge.

When the current phase of the load current IL is in a period of a range of 0 degrees to 180 degrees, that is, when the energization to the semiconductor switching element 5 of the host arm is the forward energization, the surge occurs immediately after the gate of the semiconductor switching element 5 is turned off. Thus, the period detection unit 33 determines that the energization to the lower element 5B is the forward energization when the detection voltage Vb input during the period before a point in time at which the determination time elapses from the timing at which the lower element 5B starts to be turned off exceeds the predetermined determination voltage, and outputs the signal Sh indicating the determination result to the maximum value acquisition unit 32.

Based on such a signal Sh, the maximum value acquisition unit 32 searches for the maximum value Vds_p_max from among the plurality of peak values Vds_p detected by the voltage detection unit 11 during the period in which the energization to the lower element 5B is the forward energization. By doing this, it is possible to reliably acquire the maximum value Vds_p_max corresponding to the maximum value of the turn-off surge generated during the period in which the current phase of the load current IL is in a range of 0 degrees to 180 degrees, that is, when the energization to the semiconductor switching element 5 of the host arm is the forward energization.

Third Embodiment

Figure 14:
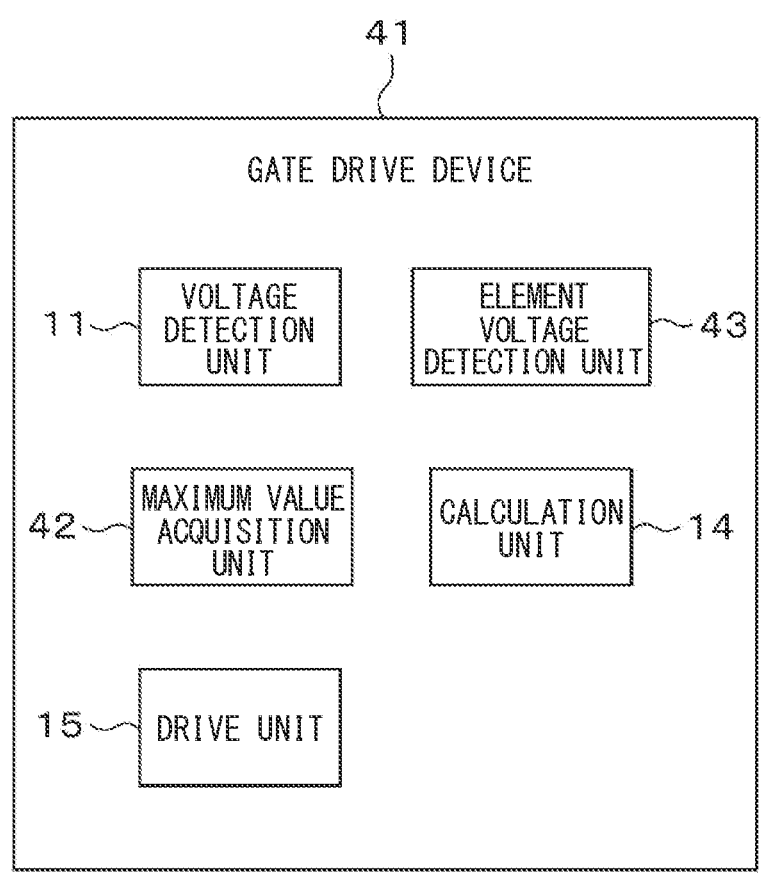
FIG. 14 is a diagram schematically illustrating each function of a gate drive device according to a third embodiment.

Hereinafter, a third embodiment will be described with reference to FIGS. 14 and 15.
<Functions of Gate Drive Device>
The present embodiment is different from the first embodiment in some of the functions of the gate drive device. That is, as illustrated in FIG. 14, a gate drive device 41 of the present embodiment is different from the gate drive device 1 of the first embodiment in that a maximum value acquisition unit 42 is provided instead of the maximum value acquisition unit 12 and an element voltage detection unit 43 is provided instead of the current direction detection unit 13.

When a voltage Vds during an on-period in which a lower element 5B which is a semiconductor switching element 5 of a host arm is turned on is a positive voltage value, it is considered that the energization to the lower element 5B is forward energization. When the voltage Vds during the on-period in which the lower element 5B is turned on is a negative voltage value, it is considered that the energization to the lower element 5B is reverse energization. In consideration of such a point, the element voltage detection unit 43 detects an element voltage during the on-period in which the semiconductor switching element 5 of the host arm is turned on, that is, the voltage Vds.

Then, based on the detection result of the element voltage detection unit 43, the maximum value acquisition unit 42 acquires a maximum value Vds_p_max among a plurality of peak values Vds_p detected by a voltage detection unit 11 during a period in which the detection value of the voltage Vds is a positive value, that is, during a period in which the energization to the lower element 5B is considered to be the forward energization. The maximum value acquisition unit 42 outputs the maximum value Vds_p_max at a timing at which the detected value of the voltage Vds changes from a positive value to a negative value, that is, at a timing at which the energization to the lower element 5B is considered to change from the forward energization to the reverse energization.
<Specific Configuration of Gate Drive Device>
As a specific configuration of the gate drive device 41 having each function described above, for example, a configuration example illustrated in FIG. 15 can be adopted. In FIG. 15, although a configuration for driving the lower element 5B is illustrated, the same configuration can be adopted for a configuration for driving an upper element 5A. In the gate drive device 41 of FIG. 15, a gate determination unit 44, a comparator 45, and a sampling hold circuit 46 constitute the element voltage detection unit 43.

The gate determination unit 44 determines whether a gate of the lower element 5B is turned on or off based on the voltage Vgs of the lower element 5B, and can include, for example, the comparator 35 illustrated in FIG. 10. The gate determination unit 44 outputs a binary signal Sk indicating a determination result of the on and off the gate of the lower element 5B. Similarly to the signal Sf output from the comparator 35 illustrated in FIG. 10, the signal Sk is at a high level when the lower element 5B is turned on, and is at a low level when the lower element 5B is turned off.

A non-inverting input terminal of the comparator 45 is connected to an interconnection node of capacitors C1 and C2, and an inverting input terminal thereof is connected to a DC power line 3. That is, a voltage corresponding to a drain voltage of the lower element 5B is input to the non-inverting input terminal of the comparator 45, and a voltage corresponding to a source voltage of the lower element 5B is input to the inverting input terminal. According to such a configuration, a binary signal Sl output from the comparator 45 is set to a high level when the voltage Vds of the lower element 5B is a positive value, that is, when "Vds>0", and is set to a low level when the voltage Vds is a negative value, that is, when "Vds<0".

The signal Sl output from the comparator 45 is input to the sampling hold circuit 46. The signal Sk output from the gate determination unit 44 is input to the sampling hold circuit 46. The sampling hold circuit 46 can grasp the on and off of the lower element 5B based on the signal Sk. The sampling hold circuit 46 samples the signal Sl at any timing during a period in which the lower element 5B is turned on, specifically, at a timing at which a certain time has elapsed after the gate is turned on.

The reason for sampling the signal Sl at such a timing is as follows. That is, the voltage Vds may not be stable immediately after the lower element 5B is turned on. Thus, in order to prevent such erroneous determination based on the unstable voltage Vds, as described above, the sampling hold circuit 46 samples the signal Sl at a timing at which a certain time has elapsed after the gate is turned on. The sampling hold circuit 46 outputs a binary signal Sm obtained by sampling and holding the signal SI.

Similarly to the signal SW of the first embodiment, the signal Sm is at a high level when it is determined that the energization to the lower element 5B is the forward energization, and is at a low level when it is determined that the energization is the reverse energization. Such a signal Sm is given to the maximum value acquisition unit 42. Similarly to the maximum value acquisition unit 12 of the first embodiment, the maximum value acquisition unit 42 searches for the maximum value Vds_p_max and the like based on the signal Sm. As a result, in the above configuration, similarly to the first embodiment, the detection voltage Vc indicating the maximum value Vds_p_max corresponding to the peak value Vds_p when the largest turn-off surge occurs in one cycle of the load current IL is input to the calculation unit 14.

According to the configuration of the present embodiment described above, similarly to the first embodiment, since control for calculating and changing the gate resistance value is performed based on the detection result of the maximum value Vds_p_max during the detection period including the period in which the semiconductor switching element 5 performs switching multiple number of times, specifically, during the period in which the current phase of the load current IL is in a range of 0 degrees to 180 degrees, it is possible to obtain the same effect as the effect of the first embodiment, that is, an effect of appropriately controlling the turn-off surge.

When a current phase of the load current IL is in a range of 0 degrees to 180 degrees, that is, when the energization to the semiconductor switching element 5 of the host arm is the forward energization, the voltage Vds during the on-period of the semiconductor switching element 5 is a positive voltage value. Thus, the maximum value acquisition unit 42 searches for the maximum value Vds_p_max from among the plurality of peak values Vds_p detected by the voltage detection unit 11 during a period in which the detection value of the voltage Vds is a positive value, that is, during a period in which the energization to the lower element 5B is considered to be the forward energization based on the detection result by the element voltage detection unit 43 that detects the voltage Vds during the on-period of the semiconductor switching element 5. By doing this, it is possible to reliably acquire the maximum value Vds_p_max corresponding to the maximum value of the turn-off surge generated during the period in which the current phase of the load current IL is in a range of 0 degrees to 180 degrees, that is, when the energization to the semiconductor switching element 5 of the host arm is the forward energization.

Fourth Embodiment

Hereinafter, a fourth embodiment will be described with reference to FIG. 15.

As illustrated in FIG. 1, the detection signal Sc indicating the detection value of the load current IL is given to the controller 6. Thus, the controller 6 can grasp the current phase of the load current IL based on the detection signal Sc. Accordingly, the controller 6 of the present embodiment illustrated in FIG. 15 generates the signal Sn corresponding to the current phase information indicating the phase of the load current IL based on the detection signal Sc.

Similarly to the signal SW in the first embodiment, the signal Sn is at a high level when a current phase of a load current IL is in a range of 0 degrees to 180 degrees, that is, when energization to a lower element 5B is forward energization, and is at a low level when the current phase of the load current IL is in a range of 180 degrees to 360 degrees, that is, when the energization to the lower element 5B is reverse energization. The controller 6 transmits the generated signal Sn to a gate drive device 51.

Figure 15:
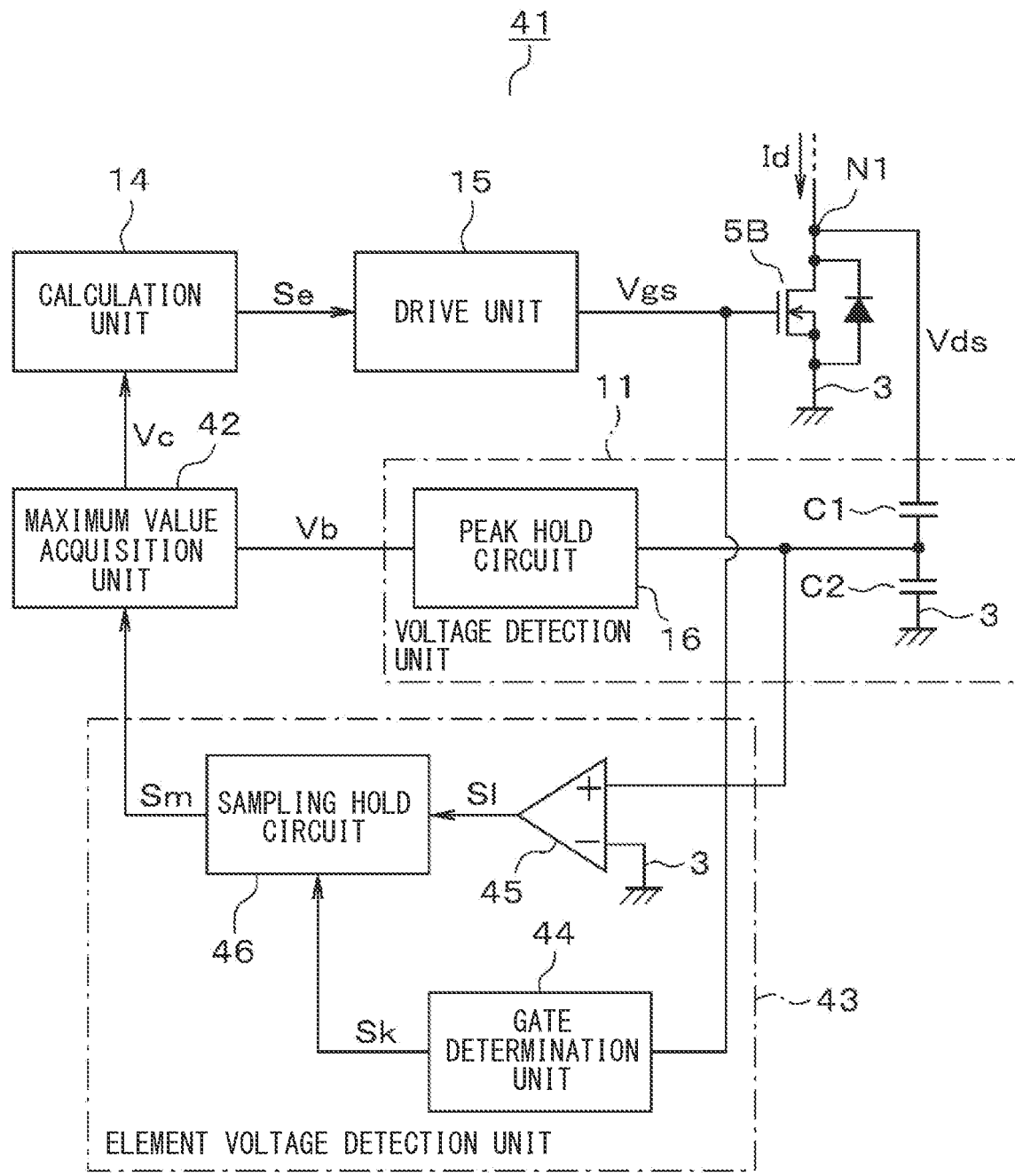
FIG. 15 is a diagram schematically illustrating a specific configuration example of the gate drive device according to the third embodiment.
Figure 16:
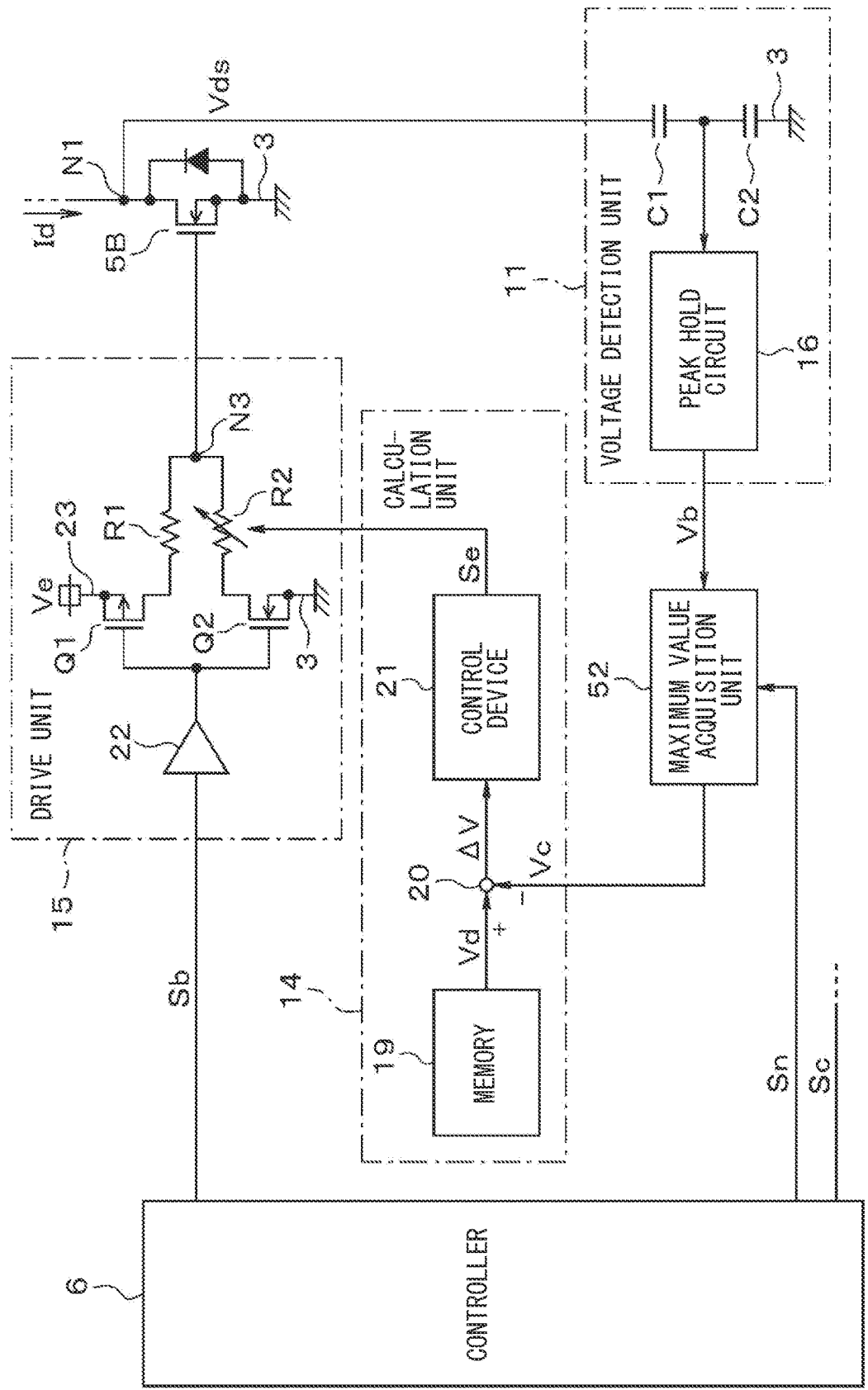
FIG. 16 is a diagram schematically illustrating a specific configuration example of a gate drive device according to a fourth embodiment.

In FIG. 15, although a configuration for driving the lower element 5B is illustrated, the same configuration can be adopted for a configuration for driving an upper element 5A. The gate drive device 51 illustrated in FIG. 15 is different from the gate drive device 1B of the first embodiment in that a maximum value acquisition unit 52 is provided instead of the maximum value acquisition unit 12 and that the current direction detection unit 13 is omitted. The maximum value acquisition unit 52 acquires current phase information of the load current IL based on the signal Sn, and acquires a maximum value Vds_p_max among a plurality of peak values Vds_p detected by the voltage detection unit 11 during a period in which the phase of the load current IL is first-half phase of one cycle of the load current IL, that is, during a period in which the current phase is in a range of 0 degrees to 180 degrees based on the current phase information.

According to the configuration of the present embodiment described above, similarly to the first embodiment, since control for calculating and changing the gate resistance value is performed based on the detection result of the maximum value Vds_p_max during the detection period including the period in which the semiconductor switching element 5 performs switching multiple number of times, specifically, during the period in which the current phase of the load current IL is in a range of 0 degrees to 180 degrees, it is possible to obtain the same effect as the effect of the first embodiment, that is, an effect of appropriately controlling the turn-off surge.

Fifth Embodiment

Figure 17:
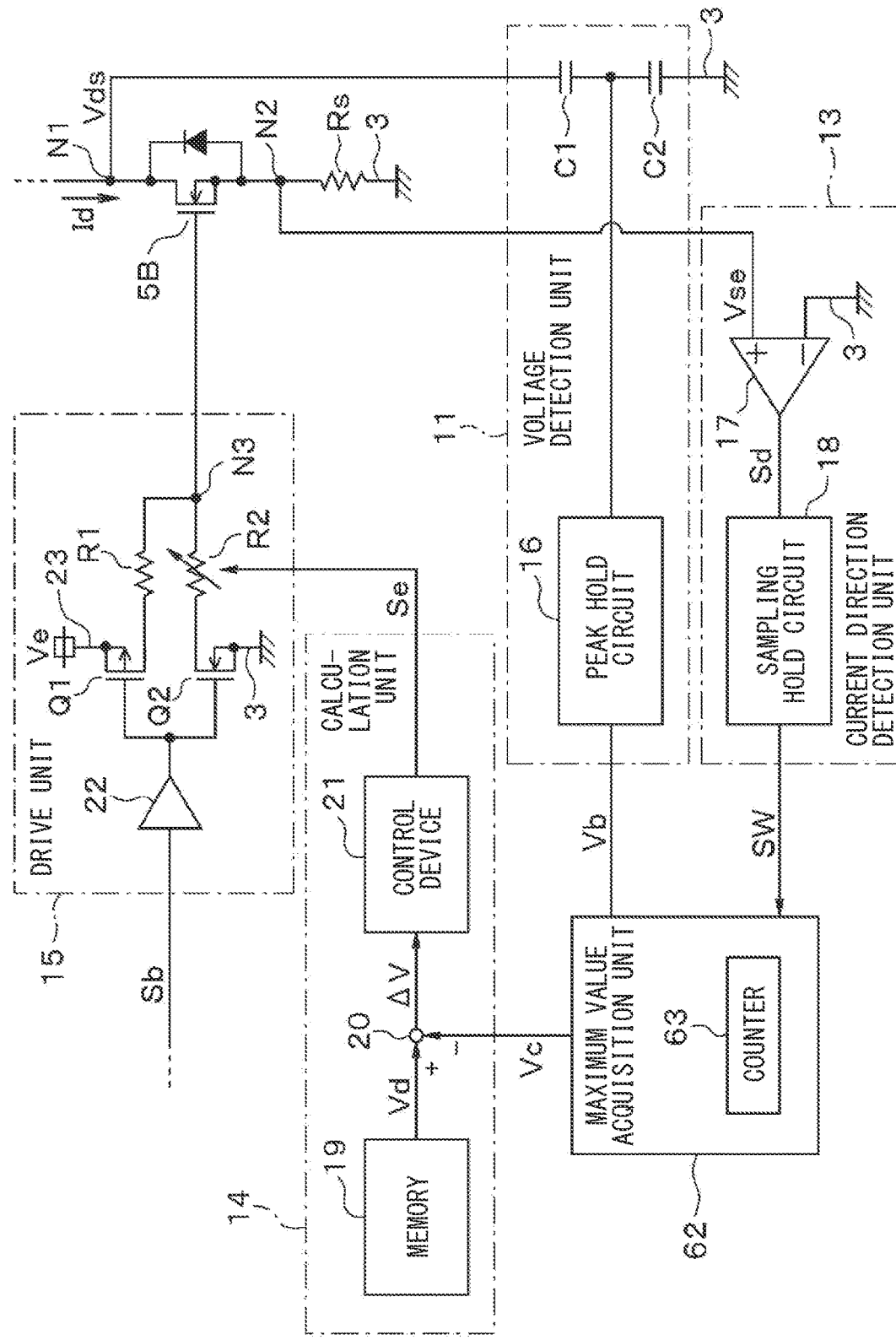
FIG. 17 is a diagram schematically illustrating a specific configuration example of a gate drive device according to a fifth embodiment.

Hereinafter, a fifth embodiment will be described with reference to FIG. 17.

The present embodiment is different from the first embodiment in a specific configuration of a gate drive device. That is, as illustrated in FIG. 17, a gate drive device 61 of the present embodiment is different from the gate drive device 1B of the first embodiment illustrated in FIG. 5 in that a maximum value acquisition unit 62 is provided instead of the maximum value acquisition unit 12. In FIG. 17, although a configuration for driving a lower element 5B is illustrated, the same configuration can be adopted for a configuration for driving an upper element 5A.

In this case, a detection period is a period corresponding to a plurality of cycles of a load current IL. The maximum value acquisition unit 62 acquires a maximum value Vds_p among a plurality of peak values Vds_p detected by a voltage detection unit 11 during the detection period corresponding to the plurality of cycles of the load current IL. A specific configuration for implementing such a function is as follows. That is, the maximum value acquisition unit 62 includes a counter 63. A signal SW output from a current direction detection unit 13 is a binary signal that is at a high level during a period in which energization to the lower element 5B is forward energization, that is, during a period in which a current phase of the load current IL is in a range of 0 degrees to 180 degrees, and is at a low level during a period in which the energization to the lower element 5B is reverse energization, that is, during a period in which the current phase of the load current IL is in a range of 180 degrees to 360 degrees. That is, a cycle of a signal SW is equivalent to the cycle of the load current IL.

Thus, the counter 63 counts such a signal SW and outputs a timing signal of a predetermined form for the cycle, that is, each time the cycle of the load current IL becomes an N cycle. N can be any integer of 2 or more. Similarly to the maximum value acquisition unit 12 of the first embodiment, during a period in which the signal SW is at a high level, that is, when the energization to the lower element 5B is the forward energization, the maximum value acquisition unit 62 searches for a maximum value from among detection values of peak values Vds_p indicated by the detection voltages Vb input each time the lower element is turned off.

In this case, the maximum value acquisition unit 62 can grasp that the cycle of the load current IL becomes the N cycle based on the timing signal output from the counter 63. The maximum value acquisition unit 62 outputs the detection voltage Vc indicating the maximum value Vds_p_max selected at this point in time to the calculation unit 14 at a timing at which the cycle of the load current IL is the N cycle and the signal SW changes from a high level to a low level, that is, at a timing at which the energization to the lower element 5B changes from the forward energization to the reverse energization when the cycle of the load current IL is the N cycle.

That is, in the above configuration, the detection voltage Vc indicating the maximum value Vds_p_max which is a largest value of the plurality of peak values Vds_p obtained during a period in which the energization to the lower element 5B is the forward energization in the N cycle of the load current IL is input to a calculation unit 14. In other words, in the above configuration, the detection voltage Vc indicating the maximum value Vds_p_max corresponding to the peak value Vds_p when the largest turn-off surge occurs in the N cycle of the load current IL is input to the calculation unit 14. The maximum value acquisition unit 62 initializes the held maximum value Vds_p_max after the detection voltage Vc is output, and starts searching for the maximum value again from a timing at which the signal SW changes from a low level to a high level, that is, a timing at which the energization to the lower element 5B becomes forward energization next time.

According to the configuration of the present embodiment described above, similarly to the first embodiment, since control for calculating and changing the gate resistance value is performed based on the detection result of the maximum value Vds_p_max during the detection period including the period in which the semiconductor switching element 5 performs switching multiple number of times, specifically, during the period in which the current phase of the load current IL is in a range of 0 degrees to 180 degrees, it is possible to obtain the same effect as the effect of the first embodiment, that is, an effect of appropriately controlling the turn-off surge.

In the present embodiment, feedback control in which the maximum value Vds_p_max during a period Ta in which the current phase is in a range of 0 degrees to 180 degrees is acquired for each of the plurality of cycles of the load current IL and a gate resistance value Rg_off based on the maximum value Vds_p_max is calculated and changed during a period Tb in which the current phase is in a range of 180 degrees to 360 degrees is executed. Thus, in the present embodiment, a control cycle of the gate resistance value Rg_off, eventually a control cycle of a surge become the same period as the plurality of cycles of the load current IL, and the target value followability for the surge control can be further improved.

Sixth Embodiment

Figure 18:
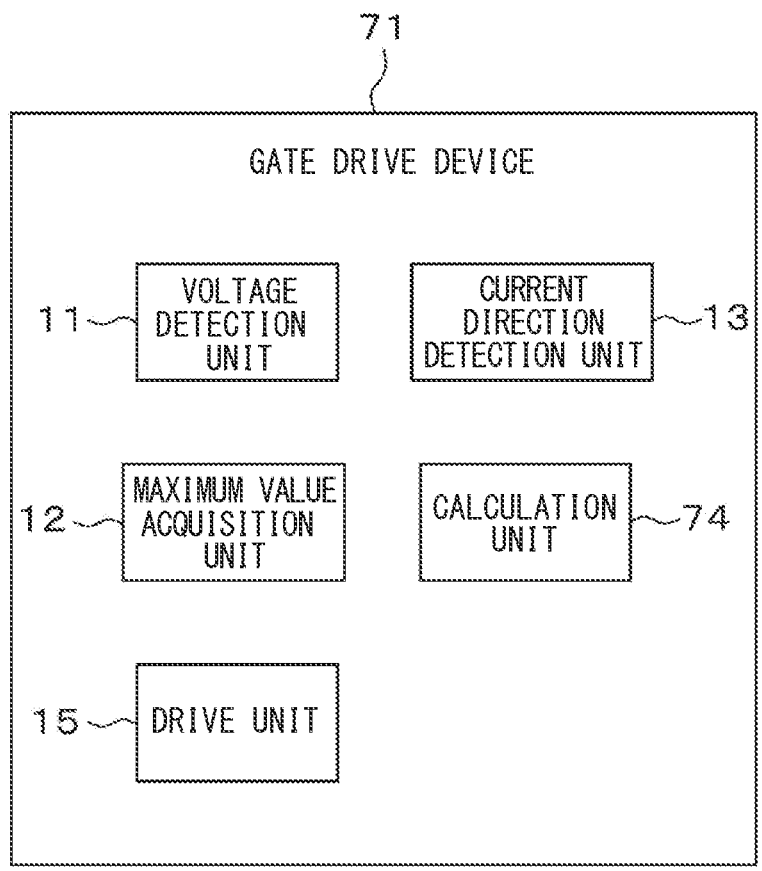
FIG. 18 is a diagram schematically illustrating each function of a gate drive device according to a sixth embodiment.

Hereinafter, a sixth embodiment will be described with reference to FIG. 18.

The present embodiment is different from the first embodiment in some of the functions of the gate drive device. That is, as illustrated in FIG. 18, a gate drive device 71 is different from the gate drive device 1 in that a calculation unit 74 is provided instead of the calculation unit 14.

In general, an element withstand voltage, that is, a surge withstand voltage of a semiconductor switching element 5 depends on a temperature around the semiconductor switching element 5. Specifically, the higher an ambient temperature, the higher the element withstand voltage, and the lower the ambient temperature, the lower the element withstand voltage. When the semiconductor switching element 5 is driven at a predetermined gate resistance value, when a load current IL fluctuates, a surge voltage also fluctuates according to the fluctuation. Specifically, when the gate resistance value is constant, a peak of the surge voltage increases as the load current IL increases, and the peak of the surge voltage decreases as the load current IL decreases. Similarly to the load current IL, it can be said that the same applies to a current Id flowing through the semiconductor switching element 5.

When the semiconductor switching element 5 is driven at a predetermined gate resistance value, when a power supply voltage Va fluctuates, the surge voltage also fluctuates according to the fluctuation. Specifically, when the gate resistance value is constant, the peak of the surge voltage increases as the power supply voltage Va increases, and the peak of the surge voltage decreases as the power supply voltage Va decreases. Similarly to the power supply voltage Va, it can be said that the same applies to an off-voltage Vds_off of the semiconductor switching element 5.

In a state where the gate resistance value is optimized, when the surge voltage increases with changes in the ambient temperature, the load current IL, the power supply voltage Va, and the like described above, a voltage exceeding the element withstand voltage may be applied to a main terminal of the semiconductor switching element 5. In a state where the gate resistance value is optimized, when the surge voltage decreases with the changes in the ambient temperature, the load current IL, the power supply voltage Va, and the like described above, the gate resistance value is set to be higher than necessary, and a switching loss increases accordingly.

In consideration of such a point, the calculation unit 74 acquires, as a fluctuation parameter, at least one of the ambient temperature, the load current IL, and the power supply voltage Va, and changes a target value of the peak value Vds_p based on a relationship between the acquired fluctuation parameter and the value detected by the voltage detection unit 11. By doing this, even when the ambient temperature, the load current IL, and the power supply voltage Va fluctuate, the gate resistance value can be optimized in consideration of these fluctuations, that is, disturbance. Accordingly, according to the present embodiment, the turn-off surge can be appropriately controlled regardless of the fluctuations in the ambient temperature, the load current, the power supply voltage Va, and the like.

Other Embodiments

The present disclosure is not limited to the embodiments described above and illustrated in the drawings, and can be arbitrarily modified, combined, or expanded without departing from the gist thereof.

The numerical values and the like shown in the above embodiments are merely examples, and the present invention is not limited thereto.

In each of the above embodiments, although the calculation unit 14 or the like calculates the value of the gate resistance of the semiconductor switching element 5 such that the deviation between the maximum value and the target value and the drive unit 15 becomes small and the gate resistance value of the semiconductor switching element 5 is changed based on the calculation result, the following configuration may be adopted instead. That is, the calculation unit 14 or the like may calculate the value of the gate current of the semiconductor switching element 5 such that the deviation between the maximum value and the target value becomes small, and the drive unit 15 may change the gate current value of the semiconductor switching element 5 based on the calculation result. Even when the configuration is changed to such a configuration, the same effects as the effects of the above-described embodiments are obtained.

The drive unit 15 is configured to continuously switch the gate resistance value of the semiconductor switching element 5, but may be configured to stepwisely switch the gate resistance value or the gate current value of the semiconductor switching element 5.

The gate drive device in each of the above embodiments is not limited to the N-channel MOSFET, and various semiconductor switching elements such as a P-channel MOSFET and an IGBT can be driven.

In each of the above embodiments, although the control target by the gate drive device 1 or the like is the surge voltage, the control target may be dV/dt instead. In this case, each configuration needs to be changed as follows. That is, in this case, the voltage detection unit 11 detects dV/dt which is a change rate of the voltage Vds at the time of switching of the semiconductor switching element 5. In this case, the maximum value acquisition unit 12 or the like acquires and outputs a maximum value among a plurality of dV/dt detected by the voltage detection unit 11 during a predetermined detection period including a period in which the semiconductor switching element 5 is switched multiple number of times.

In this case, the calculation unit 14 or the like calculates the value of the gate resistance or the gate current of the semiconductor switching element 5 such that the deviation between the maximum value output from the maximum value acquisition unit 12 or the like and the target value of the change rate determined according to the specification of the semiconductor switching element becomes small. In this case, the drive unit 15 changes the gate resistance value or the gate current value of the semiconductor switching element 5 based on the calculation result by the calculation unit 14 or the like, and drives the gate of the semiconductor switching element 5. By doing this, the control target becomes dV/dt, and an effect that dV/dt can be appropriately controlled are obtained.

Similarly to the surge voltage, the fluctuations in the ambient temperature, the load current IL, and the power supply voltage Va affect dV/dt. In general, an allowable value for dV/dt of the semiconductor switching element 5 depends on an ambient air pressure. Specifically, the higher the ambient air pressure, the higher the allowable value may be. In a state where the gate resistance value is optimized, when dV/dt increases with changes in the above-described ambient temperature, the ambient air pressure, the load current IL, the power supply voltage Va, and the like, dV/dt may exceed the allowable value. In a state where the gate resistance value is optimized, when dV/dt decreases with changes in the ambient temperature, the load current IL, the power supply voltage Va, and the like described above, the gate resistance value is set to be higher than necessary, and the switching loss increases accordingly.

Thus, when the control target is changed to be dV/dt, the calculation unit may acquire, as a fluctuation parameter, at least one of the ambient temperature, the ambient air pressure, the load current IL, and the power supply voltage Va, and changes a target value of dV/dt based on a relationship between the acquired fluctuation parameter and the detection value by the voltage detection unit. By doing this, even when the ambient temperature, the ambient air pressure, the load current IL, and the power supply voltage Va fluctuate, the gate resistance value and the like can be optimized in consideration of these fluctuations, that is, disturbance. By doing this, dV/dt can be appropriately controlled regardless of the fluctuations in the ambient temperature, the ambient air pressure, the load current, the power supply voltage Va, and the like.

Although the present disclosure has been described in accordance with examples, it is understood that the present disclosure is not limited to the examples and structures. The present disclosure also includes various modifications and modifications within an equivalent range. Various combinations and modes, and other combinations and modes including only one element, more elements, or less elements are also within the scope and idea of the present disclosure.

What is claimed is:

1. A gate drive device configured to drive a gate of a semiconductor switching element constituting an upper or lower arm of a half bridge circuit which supplies an output current, which is alternating current, to a load, the gate drive device comprising:
    a voltage detection unit configured to detect a peak value of an element voltage which is a voltage of a main terminal of the semiconductor switching element or a change rate of the element voltage when the semiconductor switching element is switching;
    a maximum value acquisition unit configured to acquire and output a maximum value among a plurality of peak values or a plurality of change rates detected by the voltage detection unit during a predetermined detection period including a period in which the semiconductor switching element performs switching multiple number of times;
    a calculation unit configured to calculate a value of a gate resistance or a gate current of the semiconductor switching element such that a deviation between the maximum value output from the maximum value acquisition unit and a target value of the peak value or a target value of the change rate determined according to a specification of the semiconductor switching element becomes small; and
    a drive unit configured to change the value of the gate resistance or the gate current of the semiconductor switching element based on a calculation result by the calculation unit, and drive the gate of the semiconductor switching element.

2. The gate drive device according to claim 1, wherein
    the detection period is a period corresponding to one cycle or a plurality of cycles of the output current, and
    the maximum value acquisition unit acquires the maximum value among the plurality of peak values or the plurality of change rates detected by the voltage detection unit during a partial period of one cycle of the output current in the detection period, and outputs the maximum value at any point in time of the detection period.

3. The gate drive device according to claim 2, wherein the maximum value acquisition unit acquires current phase information indicating a phase of the output current from a control device which controls an operation of the half bridge circuit, and acquires the maximum value among the plurality of peak values or the plurality of change rates detected by the voltage detection unit during a period in which the phase of the output current is a first-half phase of one cycle of the output current based on the current phase information.

4. The gate drive device according to claim 2, further comprising:
   a current direction detection unit configured to directly or indirectly detect a direction of an element current which is a current flowing through the semiconductor switching element, wherein
   the maximum value acquisition unit acquires the maximum value among the plurality of peak values or the plurality of change rates detected by the voltage detection unit during a period in which the element current flows in a forward direction in one cycle of the output current based on a detection result of the current direction detection unit, and outputs the maximum value at a timing at which a state where the element current flows in the forward direction is changed to a state where the element current flows in a reverse direction.

5. The gate drive device according to claim 2, wherein the maximum value acquisition unit acquires the maximum value among the plurality of peak values or the plurality of change rates detected by the voltage detection unit before a point in time when a predetermined determination time elapses from a timing at which the semiconductor switching element starts to be turned off.

6. The gate drive device according to claim 2, further comprising:
   an element voltage detection unit configured to detect the element voltage during an on-period in which the semiconductor switching element is turned on, wherein
   the maximum value acquisition unit acquires the maximum value among the plurality of peak values or the plurality of change rates detected by the voltage detection unit during a period in which a detection value of the element voltage is a positive value based on a detection result of the element voltage detection unit, and outputs the maximum value at a timing at which the detection value of the element voltage is changed from the positive value to a negative value.

7. The gate drive device according to claim 1, wherein the calculation unit acquires, as a fluctuation parameter, at least one of an ambient temperature, an ambient air pressure, the output current, and a power supply voltage supplied to the half bridge circuit, and changes the target value of the peak value or the change rate based on a relationship between the fluctuation parameter and the peak value or the change rate detected by the voltage detection unit.

8. The gate drive device according to claim 1, wherein the calculation unit executes a discrete time operation that performs a calculation only by a timing at which the maximum value is output from the maximum value acquisition unit, and
when the calculation result by the calculation unit is given, the drive unit completes a change of the value of the gate resistance or the gate current before the maximum value acquisition unit starts an operation of acquiring a next maximum value.

9. A gate drive device configured to drive a gate of a semiconductor switching element constituting an upper or lower arm of a half bridge circuit which supplies an output current, which is alternating current, to a load, the gate drive device comprising:
   a voltage detection circuit configured to detect a peak value of an element voltage which is a voltage of a main terminal of the semiconductor switching element or a change rate of the element voltage when the semiconductor switching element is switching;
   a maximum value acquisition circuit configured to acquire and output a maximum value among a plurality of peak values or a plurality of change rates during a predetermined detection period including a period in which the semiconductor switching element performs switching multiple number of times;
   a calculation circuit configured to calculate a value of a gate resistance or a gate current of the semiconductor switching element such that a deviation between the maximum value output from the maximum value acquisition circuit and a target value of the peak value or a target value of the change rate determined according to a specification of the semiconductor switching element becomes small; and
   a drive circuit configured to change the value of the gate resistance or the gate current of the semiconductor switching element based on a calculation result by the calculation circuit, and drive the gate of the semiconductor switching element.

* * * * *